US010439361B2

(12) United States Patent
Ohki et al.

(10) Patent No.: US 10,439,361 B2
(45) Date of Patent: Oct. 8, 2019

(54) SEMICONDUCTOR LASER DEVICE AND LASER LIGHT IRRADIATION APPARATUS

(71) Applicant: FURUKAWA ELECTRIC CO., LTD., Tokyo (JP)

(72) Inventors: Yutaka Ohki, Tokyo (JP); Kazuyuki Umeno, Tokyo (JP); Ryuichiro Minato, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/671,812

(22) Filed: Aug. 8, 2017

(65) Prior Publication Data

US 2017/0357067 A1    Dec. 14, 2017

Related U.S. Application Data

(63) Continuation of application No. PCT/JP2016/053893, filed on Feb. 10, 2016.

(30) Foreign Application Priority Data

Feb. 12, 2015 (JP) .................................. 2015-025871

(51) Int. Cl.
*H01S 5/22* (2006.01)
*G02B 6/42* (2006.01)
(Continued)

(52) U.S. Cl.
CPC .................. *H01S 5/22* (2013.01); *G02B 6/42* (2013.01); *G02B 6/4203* (2013.01);
(Continued)

(58) Field of Classification Search
None
See application file for complete search history.

(56) References Cited

U.S. PATENT DOCUMENTS 4,958,355 A * 9/1990 Alphonse ............ H01L 33/0045
257/98
5,606,953 A * 3/1997 Drummer ............... F02M 57/02
123/458
(Continued)

FOREIGN PATENT DOCUMENTS

EP    1 811 618 A1    7/2007
JP    8-236862       9/1996
(Continued)

OTHER PUBLICATIONS

International Search Report dated Apr. 26, 2016 in PCT/JP2016/053893, filed on Feb. 10, 2016 (with English translation).
(Continued)

*Primary Examiner* — Michelle R Connelly
(74) *Attorney, Agent, or Firm* — Oblon, McClelland, Maier & Neustadt, L.L.P.

(57) ABSTRACT

A semiconductor laser device includes a semiconductor layer portion having an active layer and performs multi-mode oscillation of laser light. Further, the semiconductor layer portion includes first and second regions, the second region being located closer to a facet on a laser light radiation side than the first region, the first region and the second region include a stripe region in which the laser light is guided, and an optical confinement effect of the laser light to the stripe region in a horizontal direction in the second region is less than that in the first region.

15 Claims, 23 Drawing Sheets

(51) Int. Cl.
*H01S 5/24* (2006.01)
*H01S 5/022* (2006.01)
*H01S 5/10* (2006.01)
*H01S 5/16* (2006.01)
*G02B 6/43* (2006.01)
*H01S 5/223* (2006.01)
*H01S 5/227* (2006.01)
*H01S 5/042* (2006.01)

(52) U.S. Cl.
CPC ........ *G02B 6/4295* (2013.01); *H01S 5/02284* (2013.01); *H01S 5/1017* (2013.01); *H01S 5/16* (2013.01); *H01S 5/24* (2013.01); *G02B 6/43* (2013.01); *H01S 5/0425* (2013.01); *H01S 5/166* (2013.01); *H01S 5/168* (2013.01); *H01S 5/2202* (2013.01); *H01S 5/227* (2013.01); *H01S 5/2231* (2013.01); *H01S 2301/16* (2013.01); *H01S 2301/185* (2013.01)

(56) References Cited

U.S. PATENT DOCUMENTS

| | | |
|---|---|---|
| 5,805,627 A | 9/1998 | Kubota et al. |
| 6,075,801 A | 6/2000 | Tamanuki et al. |
| 6,414,976 B1 | 7/2002 | Hirata |
| 6,625,182 B1 * | 9/2003 | Kuksenkov ....... H01S 3/094084 372/102 |
| 6,928,097 B2 * | 8/2005 | Chida ..................... H01S 5/227 372/46.01 |
| 7,116,692 B2 | 10/2006 | Kimura et al. |
| 7,602,828 B2 * | 10/2009 | Rossin ..................... H01S 5/20 372/43.01 |
| 7,715,457 B2 * | 5/2010 | Schmidt ................... H01S 5/16 372/43.01 |
| 8,837,895 B2 | 9/2014 | Nakano et al. |
| 9,306,373 B2 | 4/2016 | Fang et al. |
| 2002/0141467 A1 | 10/2002 | Iwai et al. |
| 2003/0112842 A1 | 6/2003 | Crawford |
| 2014/0146842 A1 * | 5/2014 | Avramescu ......... H01S 5/02461 372/44.01 |
| 2014/0233596 A1 | 8/2014 | Fang et al. |

FOREIGN PATENT DOCUMENTS

| | | |
|---|---|---|
| JP | 8-330671 A | 12/1996 |
| JP | 9-36493 | 2/1997 |
| JP | 2000-244058 | 9/2000 |
| JP | 2002-299759 | 10/2002 |
| JP | 2003-152280 | 5/2003 |
| JP | 2003-179306 | 6/2003 |
| JP | 2008-34663 | 2/2008 |
| JP | 2012-146996 | 8/2012 |
| JP | 2012-247550 | 12/2012 |

OTHER PUBLICATIONS

Written Opinion dated Apr. 26, 2016 in PCT/JP2016/053893, filed on Feb. 10, 2016.
Extended European Search Report dated Sep. 7, 2018 in European Patent Application No. 16749261.0, 9 pages.

* cited by examiner

US 10,439,361 B2

SEMICONDUCTOR LASER DEVICE AND LASER LIGHT IRRADIATION APPARATUS

CROSS-REFERENCE TO RELATED APPLICATION(S)

The present application claims priority to and incorporates by reference the entire contents of PCT International Application No. PCT/JP2016/053893 filed on Feb. 10, 2016, which is based on Japanese Patent Application No. 2015-025871 filed on Feb. 12, 2015.

BACKGROUND

The present disclosure relates to a semiconductor laser device and a laser light irradiation apparatus.

In the related art, a semiconductor laser device is disclosed which includes a semiconductor layer portion having an active layer and an electrode formed on a top surface of the semiconductor layer portion, and achieves optical confinement in a horizontal direction by a ridge structure formed immediately beneath the electrode (for example, see Japanese Patent No. 2012-146996).

Such a semiconductor laser device is placed in a package together with an optical fiber for output, and optical elements such as a lens and a mirror for coupling output light of the semiconductor laser device to the optical fiber, and used as a semiconductor laser apparatus.

SUMMARY

According to an embodiment of the present disclosure, a semiconductor laser device includes a semiconductor layer portion having an active layer and performs multi-mode oscillation of laser light. Further, the semiconductor layer portion includes first and second regions, the second region being located closer to a facet on a laser light radiation side than the first region, the first region and the second region include a stripe region in which the laser light is guided, and an optical confinement effect of the laser light to the stripe region in a horizontal direction in the second region is less than that in the first region.

DETAILED DESCRIPTION

Figure 1:
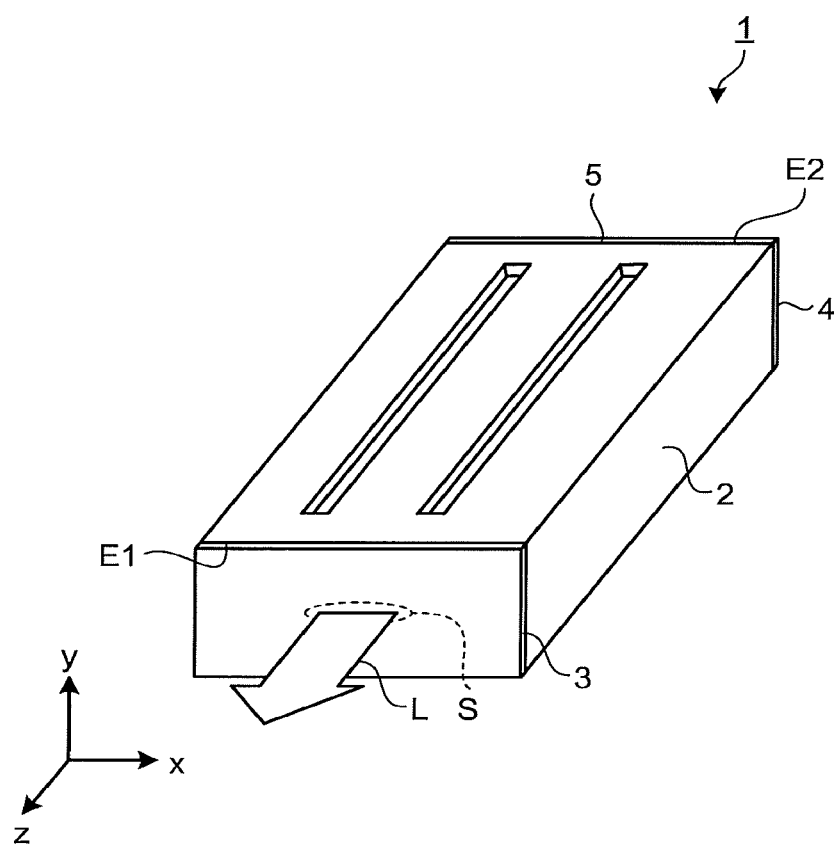
FIG. 1 is a schematic perspective view of a semiconductor laser device according to an embodiment of the present disclosure.

A semiconductor laser apparatus is practically used, for example, as an optical communication laser or an industrial laser used for processing purposes or the like. In the optical communication laser, it is necessary to propagate light over a long distance (for example, several hundreds of kilometers) through an optical fiber, and a single-mode laser is generally used for suppressing deterioration in quality of a signal. On the other hand, in the industrial laser, a multi-mode laser focused on high power is used because a power higher than that of the optical communication laser is required and there is no need to propagate light over a long distance. In the multi-mode laser, high power can be achieved by increasing a width of a waveguide of the laser to accept multiple modes in the waveguide (in other words, multi-mode). Herein, the high power refers to, for example, a power in a range from 3 W to 20 W as the power of a semiconductor laser device and a power in a range from several tens to 200 W (both at room temperature and CW driving) as the power of a semiconductor laser apparatus. High wall plug efficiency (WPE) is required in the industrial laser. The WPE is defined as a ratio of a final optical power of a semiconductor laser apparatus to an applied power (current×voltage).

In order to increase the WPE of a semiconductor laser apparatus, it is effective to increase coupling efficiency of output light of a semiconductor laser device to an optical fiber. Particularly in a semiconductor laser apparatus, including a number of semiconductor laser devices, used as a pumping light source of a high-power fiber laser, an improvement in the coupling efficiency of individual semiconductor laser devices to corresponding optical fibers has a great effect on improvement in the WPE of the semiconductor laser apparatus.

There is a need for a semiconductor laser device having a favorable coupling efficiency to an optical fiber and a laser light irradiation apparatus including the same.

Hereinafter, a semiconductor laser device and a laser light irradiation apparatus according to an embodiment of the present disclosure will be described with reference to the accompanying drawings. The present disclosure is not limited to the embodiment. In descriptions of the drawings, the same reference signs are used to describe the same or corresponding elements. In addition, it should be noted that the drawings are schematic and there may be a case where a dimensional relationship between elements, a ratio between the elements, or the like, may be different from reality. There may be a difference between each of the drawings, as well, in the dimensional relationship or the ratio.

Embodiment

First, a semiconductor laser device according to an embodiment of the present disclosure will be described. The semiconductor laser device according to the present embodiment is an edge emission-type semiconductor laser device which performs multi-mode oscillation of laser light, and includes a ridge structure formed by trench grooves, thereby achieving optical confinement in a horizontal direction and a current constriction structure. Herein, the term "to perform multi-mode oscillation" refers to "to have a wide waveguide which allows multiple waveguide modes."

FIG. 1 is a schematic perspective view of the semiconductor laser device according to the embodiment of the present disclosure. In the following description, as illustrated in FIG. 1, a semiconductor layer direction is defined as a y-axis, a laser light radiation direction is defined as a z-axis, and a horizontal direction perpendicular to the y-axis and the z-axis is defined as an x-axis. As illustrated in FIG. 1, a semiconductor laser device 1 includes a semiconductor layer portion 2 having an active layer, a low-reflectivity coating 3, and a high-reflectivity coating 4. The low-reflectivity coating 3 is formed on a facet E1 on a laser light radiation side of the semiconductor layer portion 2 and has a reflectivity of, for example, 10% or less. The high-reflectivity coating 4 is formed on a facet E2 on a rear facet side opposite to the facet E1 and has a reflectivity of, for example, 90% or more. The semiconductor laser device 1 guides laser light L in a stripe region S and radiates the laser light L via the low-reflectivity coating 3.

Figure 2:
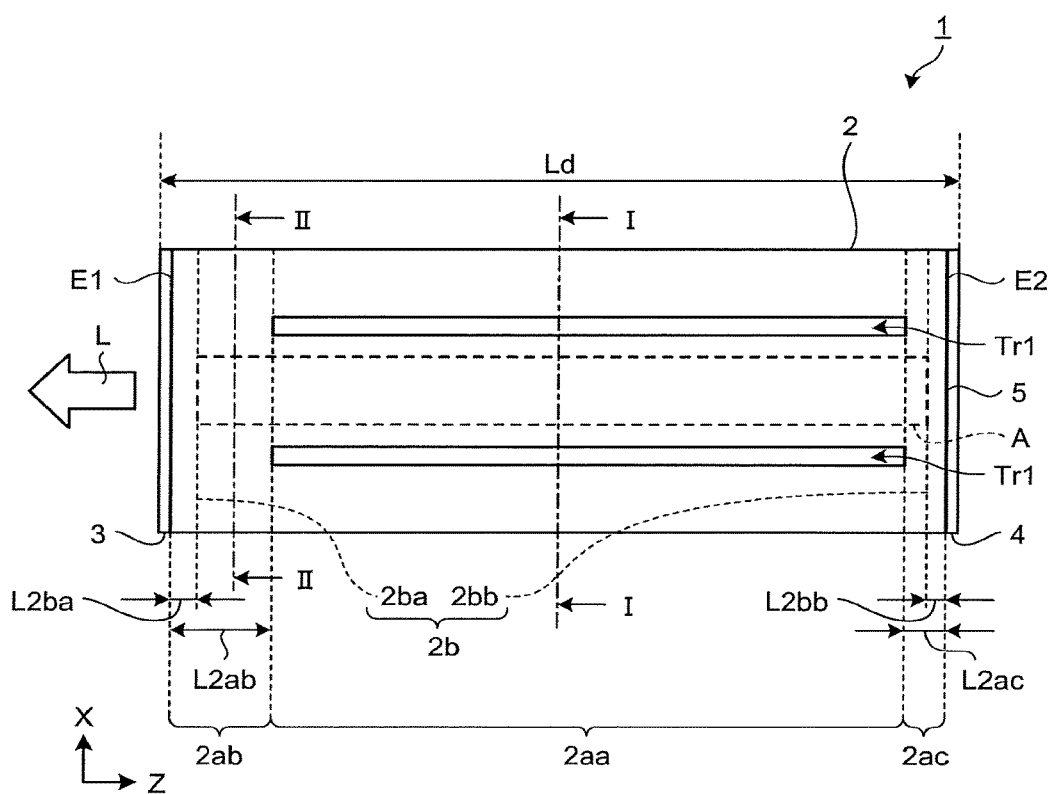
FIG. 2 is a top view of the semiconductor laser device illustrated in FIG. 1.

FIG. 2 is a top view of the semiconductor laser device illustrated in FIG. 1. As illustrated in FIG. 2, the semiconductor laser device 1 includes an upper electrode 5 formed on a top surface of the semiconductor layer portion 2. The upper electrode 5 is insulated in a region outside an opening A by a passivation film described later, and is in contact with the semiconductor layer portion 2 inside the opening A.

The semiconductor layer portion 2 includes a second region 2ab located in the vicinity of the facet E1, a third region 2ac located in the vicinity of the facet E2, and a first region 2aa located between the second region 2ab and the third region 2ac.

On the top surface of the semiconductor layer portion 2 in the first region 2aa, trench grooves Tr1 stretching in a laser light radiation direction (z-direction) are formed, and the stripe region S is formed between the trench grooves Tr1. The trench grooves Tr1 form an optical waveguide structure in a horizontal direction (x-direction) as described later. On the other hand, no trench groove Tr1 is formed in the second region 2ab and the third region 2ac, and the top surface of the semiconductor layer portion 2 has a constant height.

Therefore, in the second region 2ab and the third region 2ac, there is no optical confinement effect of the laser light in the horizontal direction to the stripe region S, and the optical confinement effect of the laser light to the stripe region S in the horizontal direction is smaller than that in the first region 2aa.

The semiconductor laser device 1 has a device length Ld of, for example, 1 mm to 6 mm, more preferably approximately 3 mm to 5 mm. A length L2ab of the second region 2ab in the z-direction is, for example, 200 µm. A length L2ac of the third region 2ac in the z-direction is, for example, 150 µm.

Figure 3:
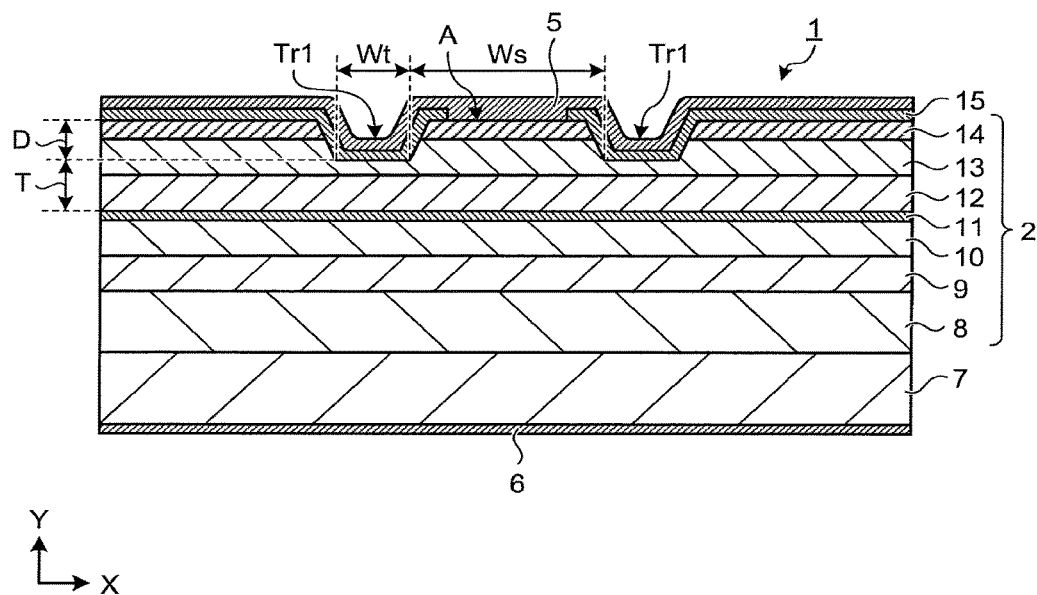
FIG. 3 is an example of a cross-sectional view taken along a line I-I of the semiconductor laser device illustrated in FIG. 2.

FIG. 3 is an example of a cross-sectional view taken along a line I-I of the semiconductor laser device illustrated in FIG. 2. As illustrated in FIG. 3, the semiconductor laser device 1 includes the upper electrode 5, a lower electrode 6 formed on an undersurface, a substrate 7 including an n-type GaAs, the semiconductor layer portion 2 formed on the substrate 7, and a passivation film 15.

The semiconductor layer portion 2 includes an n-type buffer layer 8, an n-type cladding layer 9, an n-type guide layer 10, an active layer 11, a p-type guide layer 12, a p-type cladding layer 13, and a p-type contact layer 14, sequentially formed on the substrate 7.

The n-type buffer layer 8 is made of GaAs, and is a buffer layer for allowing a stacked structure including a high-quality epitaxial layer to grow on the substrate 7. The n-type cladding layer 9 and the n-type guide layer 10 are made of AlGaAs in which a refractive index and a thickness thereof are set so as to achieve a desired optical confinement state in a layer direction. An Al composition of the n-type guide layer 10 is, for example, 20% or more and less than 40%. The n-type cladding layer 9 has a refractive index smaller than that of the n-type guide layer 10. The n-type guide layer 10 preferably has a thickness of 50 nm or greater, for example, approximately 1,000 nm. The n-type cladding layer 9 preferably has a thickness of approximately 1 µm to 3 µm. These n-type semiconductor layers include, for example, silicon (Si) as an n-type dopant.

The active layer 11 includes a lower barrier layer, a quantum well layer, and an upper barrier layer, and has a single quantum well (SQW) structure. The lower barrier layer and the upper barrier layer have a barrier function for confining carriers to the quantum well layer, and are made of high-purity AlGaAs which is not intentionally doped. The quantum well layer is made of high-purity InGaAs which is not intentionally doped. An In composition and a film thickness of the quantum well layer and compositions of the lower barrier layer and the upper barrier layer are set in accordance with a desired center emission wavelength (for example, 900 nm to 1080 nm). The structure of the active layer 11 may be a multi quantum well (MQW) structure including the desired number of repetitions of the stacked structure of the quantum well layer and the barrier layers formed on and beneath the quantum well layer, respectively, or may be a single quantum well structure. Although the configuration in the high-purity layer which is not intentionally doped has been described above, there may be a case where a donor or an acceptor is intentionally added to the quantum well layer, the lower barrier layer, and the upper barrier layer.

The p-type guide layer 12 and the p-type cladding layer 13 are paired with the n-type cladding layer 9 and the n-type guide layer 10, and are made of AlGaAs in which respective refractive indexes and thicknesses are set so as to achieve a desired optical confinement state in the layer direction. An Al composition of the p-type guide layer 12 is, for example, 20% or more and less than 40%. The p-type cladding layer 13 has a refractive index smaller than that of the p-type guide layer 12. An Al composition of the p-type cladding layer 13 is set to be somewhat greater than that of the n-type cladding layer 9 so as to shift an optical field in the layers in a direction of the n-type cladding layer 9 to reduce a waveguide loss. The Al composition of the p-type guide layer 12 is set to be smaller than that of the Al composition of the p-type cladding layer 13. The p-type guide layer 12 preferably has a thickness of 50 nm or greater, for example, approximately 1000 nm. The p-type cladding layer 13 preferably has a thickness of approximately 1 µm to 3 µm.

These p-type semiconductor layers include carbon (C) as a p-type dopant. A C concentration of the p-type guide layer 12 is set, for example, to 0.1 to $1.0 \times 10^{17}$ cm$^{-3}$, and is preferably approximately 0.5 to $1.0 \times 10^{17}$ cm$^{-3}$. A C concentration of the p-type cladding layer 13 is set, for example, to $1.0 \times 10^{17}$ cm$^{-3}$ or greater. The p-type contact layer 14 includes GaAs doped with Zn or C at a high concentration.

The passivation film 15 is an insulating film including, for example, SiN$_x$, and has the opening A.

As illustrated in FIG. 3, the trench grooves Tr1 are formed in a region immediately beneath the opening A of the semiconductor layer portion 2, and consequently, the ridge structure is formed to confine light in the x-direction. Furthermore, in the semiconductor laser device 1, the current constriction structure is achieved by restricting a contact area between the upper electrode 5 and the semiconductor layer portion 2 by the passivation film 15.

In FIG. 3, a waveguide width Ws is, for example, 80 µm or more and 500 µm or less. Here, the waveguide width Ws refers to a width of the ridge structure at a bottom portion thereof, and coincides here with an interval between two trench grooves Tr1. When output from the semiconductor laser device 1 is coupled to an optical fiber, it is preferable for the waveguide width Ws to have substantially the same dimension as a core diameter of the optical fiber from a viewpoint of coupling efficiency. A trench width Wt corresponding to a width of the trench grooves Tr1 is, for example, five to several tens micrometers. A trench groove depth D refers to a depth from the topmost surface of the semiconductor layer portion 2 to the bottom of each trench groove Tr1. A ridge remaining thickness T, which refers to a thickness from the top surface of the active layer 11 to the bottom of each trench groove Tr1, is 500 nm to 1500 nm, for example. The ridge remaining thickness T is, for example, preferably 600 nm to 1100 nm so as to achieve sufficient optical confinement in the horizontal direction and favorable electro-optical properties.

Figure 4:
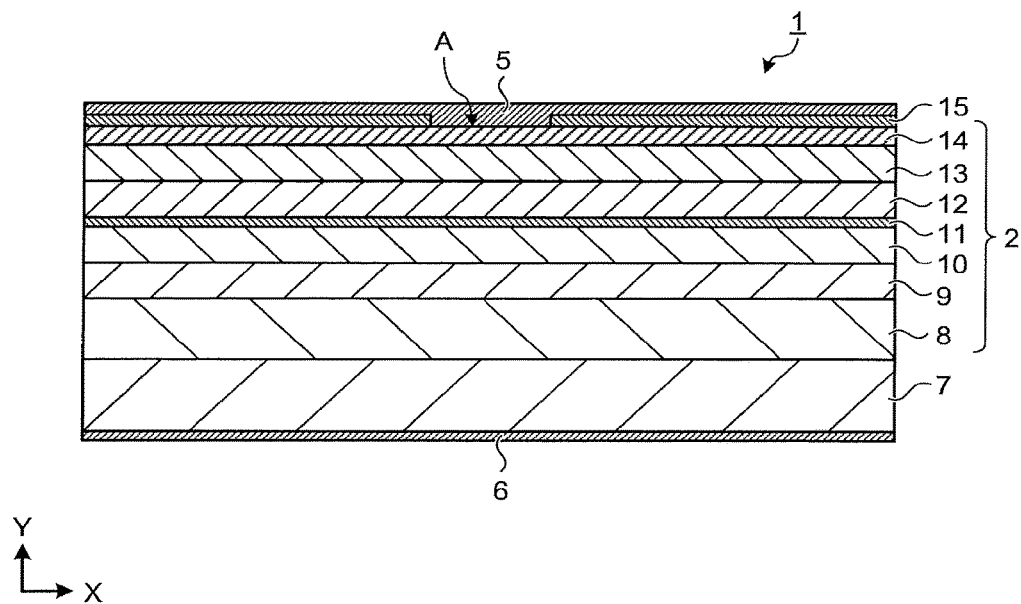
FIG. 4 is an example of a cross-sectional view taken along a line II-II of the semiconductor laser device illustrated in FIG. 2.

Meanwhile, FIG. 4 is an example of a cross-sectional view taken along a line II-II of the semiconductor laser device illustrated in FIG. 2. As illustrated in FIG. 4, no trench groove is formed in the semiconductor layer portion 2 in the second region 2ab.

As illustrated in FIG. 2, the semiconductor layer portion 2 of the semiconductor laser device 1 includes a current non-injection region 2b into which no current is injected. Current injection into the current non-injection region 2b is inhibited, for example, by an insulating film including SiN$_x$, SiO$_2$, or the like. The current non-injection region 2b includes a first current non-injection region 2ba formed on a facet E1 side and a second current non-injection region 2bb formed on a facet E2 side along the z-direction. Here, when an optical power increases in the semiconductor laser device, heat may be generated by a laser light absorption in the facets. In that case, a phenomenon called catastrophic optical damage (COD) may be occurred in which a facet is melted by the generated heat to stop a function of the laser device, which causes a reliability problem. In order to solve the problem, the semiconductor layer portion 2 of the semiconductor laser device 1 is provided with the current non-injection region 2b into which no current is injected in the vicinity of each of the facets.

A length L2ba of the first current non-injection region 2ba and a length L2bb of the second current non-injection region 2bb are, for example, 100 µm each. However, the length L2ba of the first current non-injection region 2ba and the length L2bb of the second current non-injection region 2bb may be different from each other, or a current non-injection region may be formed only in the first current non-injection region 2ba.

Next, an operation of the semiconductor laser device 1 will be described. First, a voltage is applied to between the lower electrode 6 and the upper electrode 5 to inject carriers into the active layer 11 from the n-type semiconductor layers and p-type semiconductor layers. At that time, a current path of hole carriers injected from the upper electrode 5 via the p-type semiconductor layers is constricted by the passivation film 15, and consequently, the hole carriers are efficiently injected into the active layer 11 with increased current density. A current injection width refers to a width into which a current is injected at that time. The active layer 11 with the injected current emits light having a predetermined center emission wavelength. The emitted light is confined in the vicinity of the active layer 11 by the ridge structure in the x-axis direction and by a refractive-index difference between the guide layers and the cladding layers in the y-axis direction, and guided in the z-axis direction, and laser oscillation is performed by a light-amplifying effect of the active layer 11 and an optical resonator formed by the low-reflectivity coating 3 and the high-reflectivity coating 4. Consequently, the semiconductor laser device 1 radiates the laser light L as illustrated in FIG. 1.

Here, how to achieve a semiconductor laser device having a favorable coupling efficiency to an optical fiber will be considered. In order to couple the laser light L output by the semiconductor laser device 1 to the optical fiber with high efficiency, it is preferable for an angle of a far field pattern in a horizontal direction (FFPh) to be small, and for a width of a horizontal near field pattern in the horizontal direction (NFP) to be narrow. When the angle of the FFPh is large, the following problem occurs: there may be a case where the laser light L is coupled to cladding of the optical fiber to decrease coupling efficiency, and light leaked from the cladding is converted into heat to cause damage to a coating and the like of the optical fiber. Furthermore, when the width of the NFP is wide, a similar problem occurs. The angle of the FFPh used herein refers to all angles with which optical power of $1/e^2$ is obtained with respect to peak optical power of the laser light L output from the semiconductor laser device 1, and the width of the NFP used herein refers to all widths with which optical power of 1/e² is obtained with respect to the peak optical power of the laser light L output from the semiconductor laser device 1. The horizontal direction refers to the x-axis direction in FIG. 1.

First, in order to narrow the width of the NFP, the waveguide width Ws is narrowed. This is because when the waveguide width Ws is narrowed, a width in the horizontal direction of the laser light L to be emitted is narrowed. However, simply narrowing the waveguide width Ws does not improve the coupling efficiency of the semiconductor laser device 1 to the optical fiber.

Figure 5:
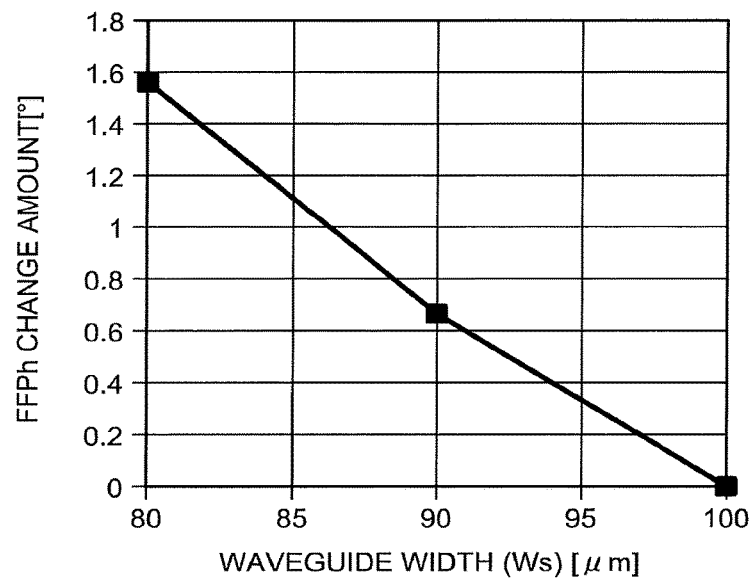
FIG. 5 is a graph indicating a relationship between an FFPh change amount and a waveguide width.

FIG. 5 is a graph indicating a relationship between an FFPh change amount and a waveguide width. As illustrated in FIG. 5, the angle of the FFPh is increased as the waveguide width Ws is narrowed from a waveguide width Ws of 100 μm as a reference. In other words, when the waveguide width Ws is narrowed, the width of the NFP is narrowed but the angle of the FFPh is increased, and therefore, the coupling efficiency of the semiconductor laser device 1 to the optical fiber cannot be sufficiently improved.

The reason why the angle of the FFPh is increased when the waveguide width Ws is narrowed is presumed as follows. First, when the waveguide width Ws is narrow, a contact area between the upper electrode 5 and the semiconductor layer portion 2 is reduced, and resistance is increased. When the resistance is increased, generated heat is increased even when the same current is injected. When the generated heat is increased to raise a temperature, a refractive-index difference between a region where the emitted laser light L is guided and a region other than that is increased. The increase in the refractive-index difference achieves higher-order horizontal lateral mode confinement to the region where the laser light L is guided.

As described above, there is a relationship in which when one is decreased, another is increased, i.e. a trade-off, between the width of the NFP and the angle of the FFPh.

Figure 14:
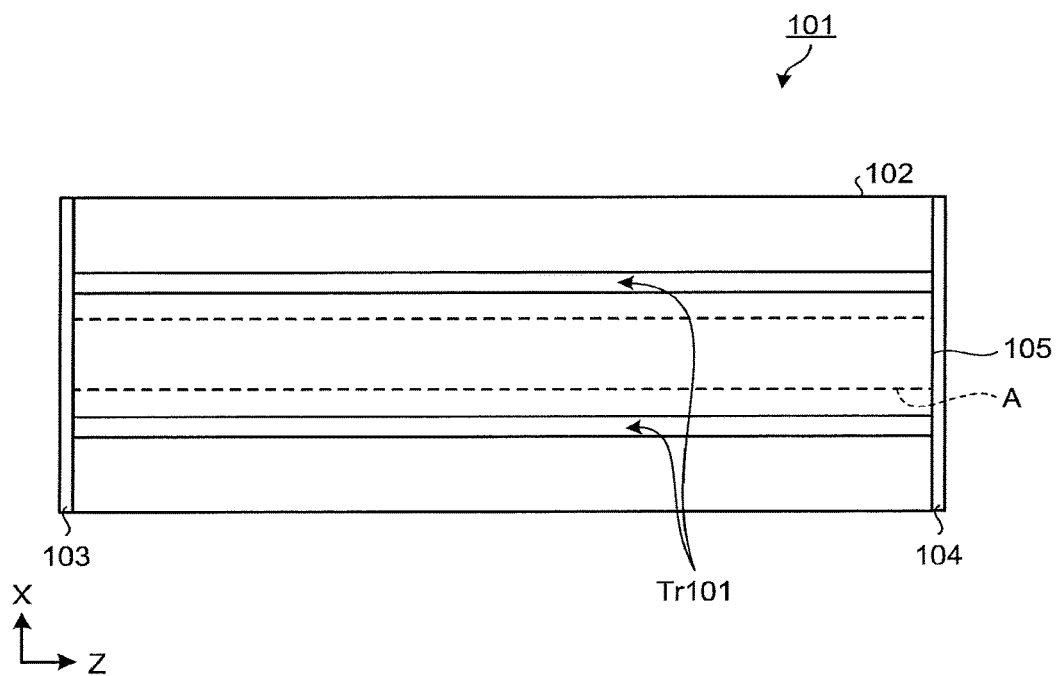
FIG. 14 is a top view of an example of a known semiconductor laser device.
Figure 15:
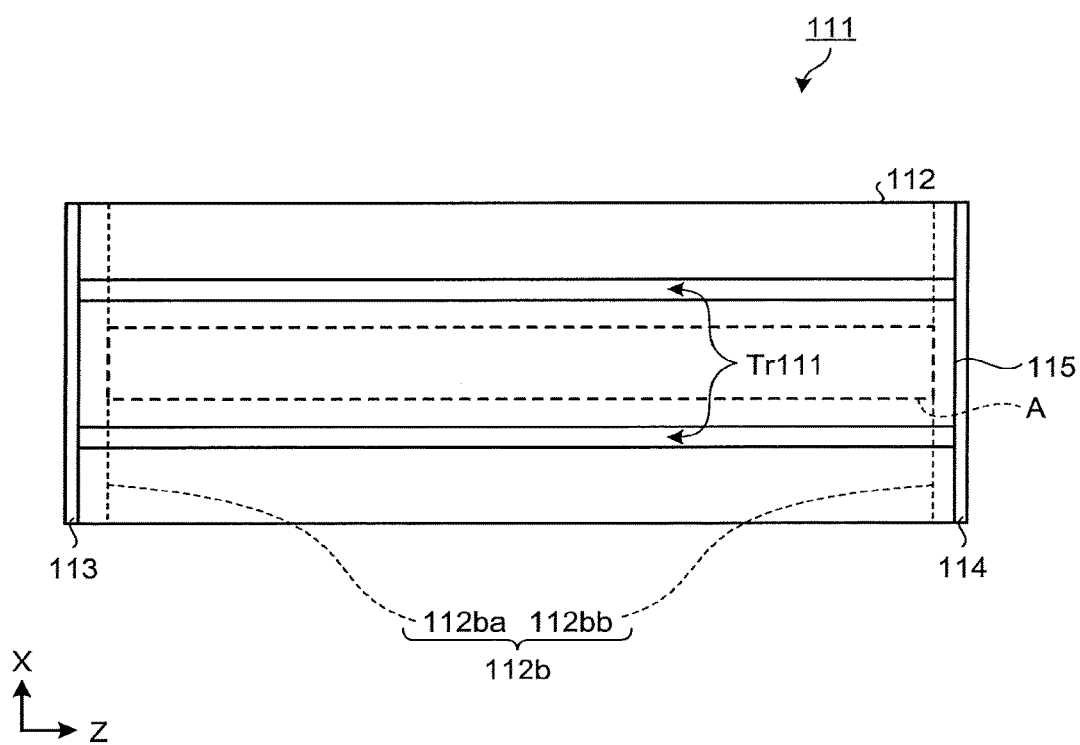
FIG. 15 is a top view of an example of a known semiconductor laser device.

Here, for the purpose of comparison to the semiconductor laser device 1, known semiconductor laser devices will be described. FIGS. 14 and 15 are top views of examples of the known semiconductor laser devices. As illustrated in FIG. 14, the known semiconductor laser device 101 includes a semiconductor layer portion 102 having an active layer, a low-reflectivity coating 103, a high-reflectivity coating 104, and an upper electrode 105 for injecting a current into the active layer. The semiconductor layer portion 102 has trench grooves Tr101 successively formed in a z-direction to include both facets, and thereby strong optical confinement is achieved in a horizontal direction. Similarly, the known semiconductor laser device 111 illustrated in FIG. 15 includes a semiconductor layer portion 112 having an active layer, a low-reflectivity coating 113, a high-reflectivity coating 114, and an upper electrode 115 for injecting a current into the active layer. The semiconductor layer portion 112 has trench grooves Tr111 successively formed in a z-direction to include both facets, and thereby strong optical confinement is achieved in a horizontal direction. The semiconductor layer portion 112 includes a current non-injection region 112b into which no current is injected and which includes a first current non-injection region 112ba and a second current non-injection region 112bb, and thus occurrence of the COD is suppressed.

In the semiconductor laser devices 101 and 111, the semiconductor layer portions 102 and 112 have the trench grooves Tr101 and Tr111 successively formed in the z-direction to include both facets, respectively. As a result, light of high-order horizontal lateral mode having been excited by the semiconductor laser device 101 and that having been excited by the semiconductor laser device 111 remains confined in the ridge structures respectively formed by the trench grooves Tr101 and Tr111, and are output as laser light via the low-reflectivity coatings 103 and 113, respectively.

On the contrary, in the semiconductor laser device 1 according to the present embodiment, no trench groove is formed in the second region 2ab on the facet E1 side as illustrated in FIG. 2. In the second region 2ab, there is no trench groove and thus there is no ridge structure, and accordingly, high-order horizontal lateral mode confinement is weakened. Then, in the semiconductor laser device 1, light of the high-order horizontal lateral mode with a large angle of the FFPh is reduced in light included in the laser light L to be output. As a result, an angle of the FFPh of the laser light L to be output by the semiconductor laser device 1 is decreased. At that time, the width of the NFP almost remains unchanged unlike the case of changing the waveguide width Ws, with the result that the coupling efficiency of the semiconductor laser device 1 to the optical fiber is improved.

Although there is a trade-off relationship between the width of the NFP and the angle of the FFPh as described above, the semiconductor laser device 1 has a configuration in which the angle of the FFPh is decreased and the width of the NFP is not increased.

Figure 6:
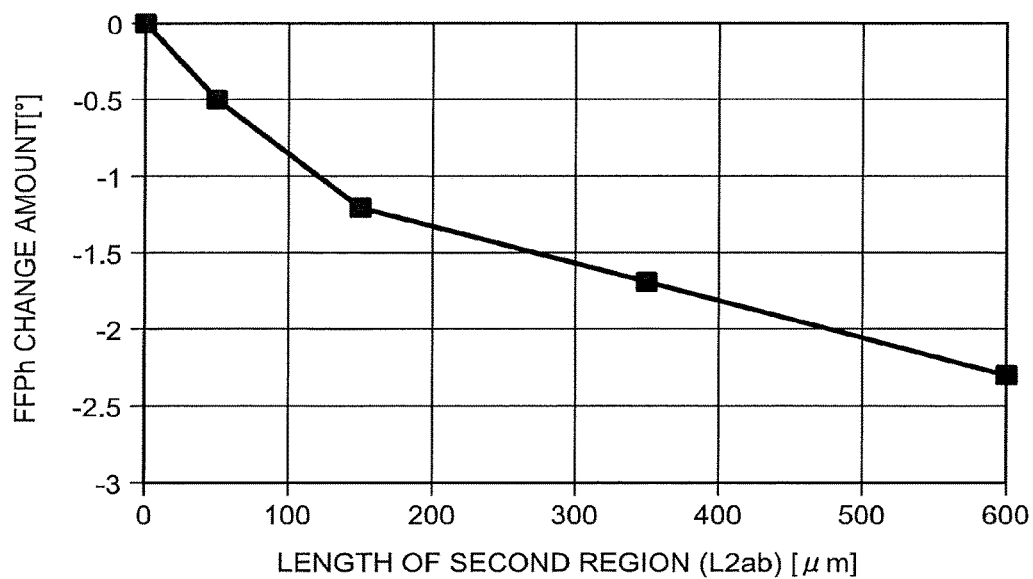
FIG. 6 is a graph indicating a relationship between an FFPh change amount and the length of a second region.

FIG. 6 is a graph indicating a relationship between the FFPh change amount and the length of the second region. As illustrated in FIG. 6, when the length L2ab of the second region 2ab is increased, an effect of reducing the high-order horizontal lateral mode confinement is increased, and accordingly, the FFPh is decreased. According to FIG. 6, when the length L2ab of the second region 2ab is, for example, 100 μm or greater, an effect of decreasing the FFPh is exerted, and when the length L2ab is 150 μm or greater, the FFPh is decreased by one degree or more, which is more preferable. Thus, the semiconductor laser device 1 is proved to be a semiconductor laser device having a small angle of the FFPh and a favorable coupling efficiency to the optical fiber.

Figure 7:
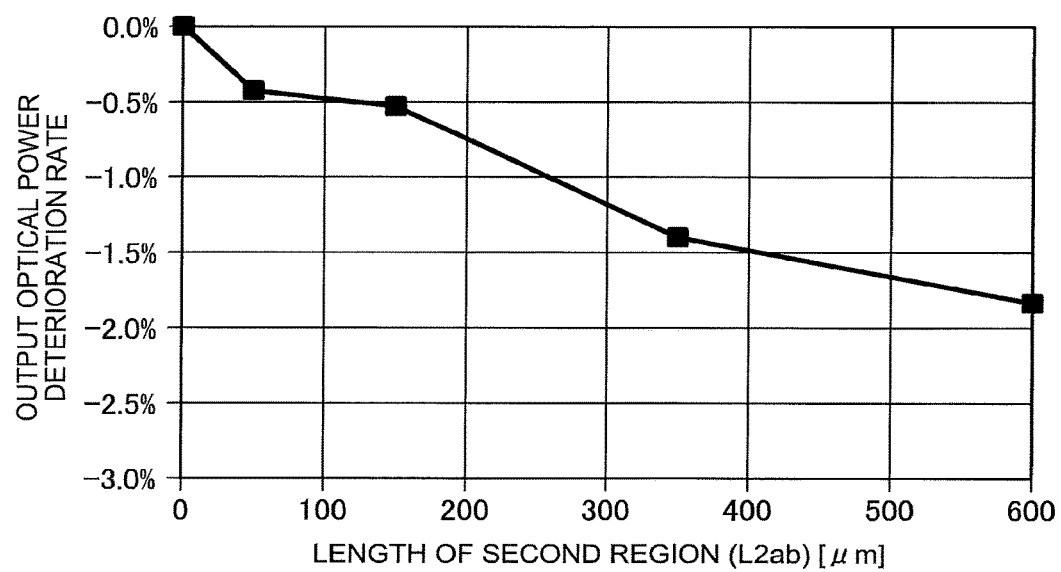
FIG. 7 is a graph indicating a relationship between a power deterioration rate and the length of the second region.

FIG. 7 is a graph indicating a relationship between a power deterioration rate and the length of the second region. As illustrated in FIG. 7, when increasing the length L2ab of the second region 2ab, output optical power of the semiconductor laser device 1 is deteriorated. The reason thereof is as follows. Since the semiconductor laser device 1 has no trench groove and therefore has no ridge structure in the second region 2ab, optical confinement in a horizontal direction is weakened in this region. In other words, when the length L2ab of the second region 2ab is increased too much, the output optical power of the semiconductor laser device 1 is deteriorated, which is not preferable. According to FIG. 7, when the length L2ab of the second region 2ab is 250 μm or less, a deterioration rate of the output optical power can be suppressed to within 1%.

Therefore, in accordance with measurement results illustrated in FIGS. 6 and 7, it is preferable that the length L2ab of the second region 2ab be 100 μm or greater and 250 μm or less. By providing a region with weak optical confinement in a horizontal direction only in a part of the semiconductor laser device 1 as described above, a semiconductor laser device having a favorable coupling efficiency to an optical fiber can be provided while suppressing the reduction in optical power to be in an appropriate range. In addition, there is a trade-off relationship between the optical power and the FFPh with respect to the length L2ab as can be seen from FIGS. 6 and 7. In single-mode laser, the optical power is rapidly decreased when increasing the length L2ab, and therefore, it is difficult to set a preferable length L2ab. On the other hand, the semiconductor laser device 1 is multi-mode laser, and consequently, the length L2ab can be set to a length in an industrially viable range.

Although the length L2ba of the first current non-injection region 2ba is fixed to 100 µm in the measurement illustrated in each of FIGS. 6 and 7, it is preferable to set the length L2ba of the first current non-injection region 2ba to an optimum value in accordance with the length L2ab of the second region 2ab. Particularly when the length L2ba of the first current non-injection region 2ba is greater than the length L2ab of the second region 2ab, a region into which no current is injected and which includes no trench groove and has weak optical confinement in a horizontal direction becomes longer, and there occurs significant deterioration in the output optical power of the semiconductor laser device 1. Therefore, the length L2ba of the first current non-injection region 2ba is preferably less than the length L2ab of the second region 2ab. In accordance with the length L2ab, the length L2ba is preferably 10 µm to 100 µm less than the length L2ab, for example. (In that case, the output optical power is increased by approximately several percent in comparison to a case where the length L2ba is longer than or substantially as long as the length L2ab.) Similarly, the length L2bb of the second current non-injection region 2bb is preferably less than the length L2ac of the third region 2ac. In accordance with the length L2ac, preferably, the length L2bb is less than the length L2ac by 10 µm to 100 µm, for example.

Figure 24:
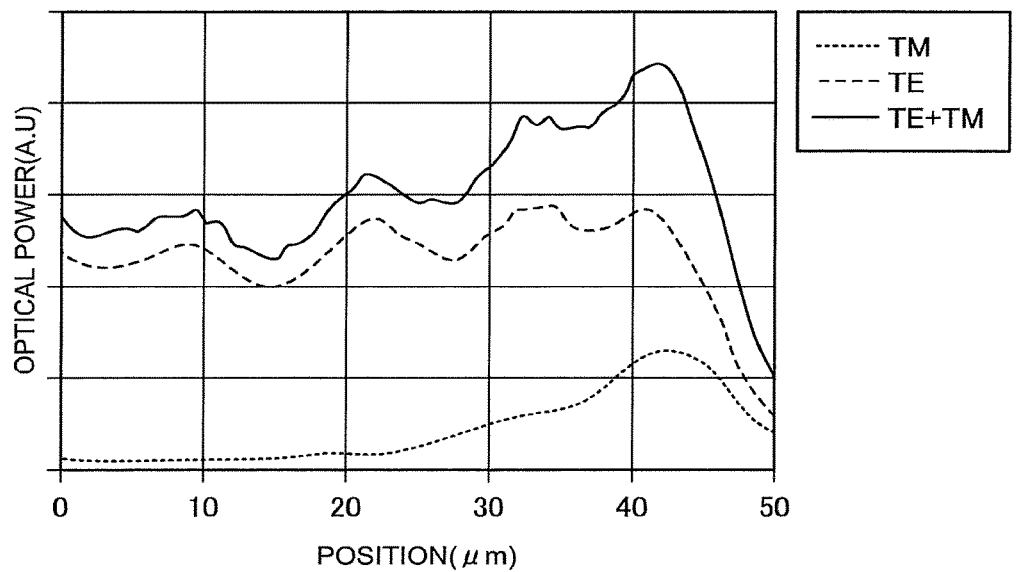
FIG. 24 is a graph illustrating a horizontal optical power distribution of an NFP obtained from a semiconductor laser device in related art.

FIG. 24 is horizontal optical power distribution of an NFP obtained from a semiconductor laser device in related art. FIG. 24 illustrates a TE mode component and a TM mode component included in the NFP, and a combination of these components. The waveguide width Ws is 100 µm. As illustrated in FIG. 24, a large peak of the optical power is observed in a region corresponding to an edge of the waveguide. Such locally concentrated optical power may cause the COD, which is not preferable in view of reliability. In addition, it has been found that the local peak of the optical power observed in the edge of the waveguide includes the TM mode component largely. Here, although there is a polarization combining technique as a technique to combine laser light output from a semiconductor laser device with one optical system, it is not preferable for the laser light to include the TM mode component largely when using that technique.

Figure 25:
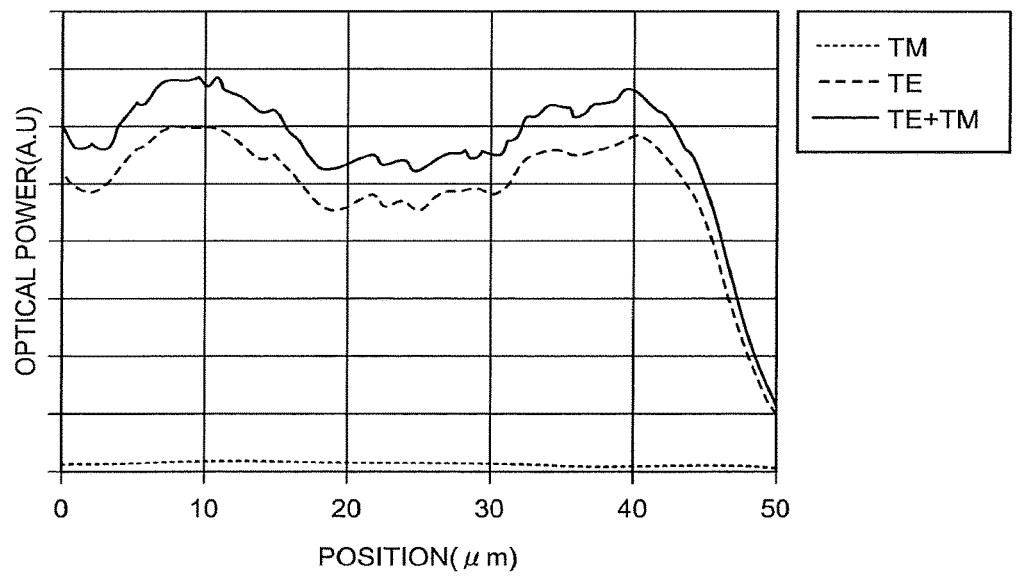
FIG. 25 is a graph illustrating the horizontal optical power distribution of an NFP obtained from a semiconductor laser device having a structure according to the embodiment of the present disclosure.

FIG. 25 illustrates a horizontal optical power distribution of an NFP obtained from a semiconductor laser device having a structure of the embodiment of the present disclosure illustrated in FIG. 1. FIG. 25 illustrates the TE mode component and the TM mode component included in the NFP, and a combination of these components. The waveguide width Ws is 100 µm. As illustrated in FIG. 25, a large peak of the optical power in a region corresponding to an edge of the waveguide observed in FIG. 24 is not observed, and the optical power is more uniform with respect to positions. Therefore, the COD caused by locally concentrated optical power is suppressed, which is preferable in view of reliability. In addition, as can be seen from FIG. 25, a TM mode component included in the NFP is small, which is preferable when using the polarization combining technique.

In the semiconductor layer portion 2 of the semiconductor laser device 1, the trench groove is not formed in the second region 2ab, nor in the third region 2ac. However, in order to decrease the angle of the FFPh, it is sufficient to provide a region including no trench groove formed therein in the vicinity of a facet on a laser light radiation side, and trench grooves may be formed in the third region 2ac. In the semiconductor laser device 1, no trench groove is formed in the third region 2ac from a viewpoint of continuity of a cleavage plane at a time of cleaving the substrate 7 in a manufacturing process.

The deeper a trench groove depth D (see FIG. 3) becomes and the smaller a ridge remaining thickness T becomes, the greater a refractive-index difference between a region where the laser light L is guided and a region other than that becomes, a higher-order horizontal lateral mode confinement is achieved. Therefore, the effect of the present disclosure for decreasing the FFPh is evidently exerted in such a case.

As described above, the semiconductor laser device 1 according to the present embodiment is a semiconductor laser device having a favorable coupling efficiency to an optical fiber.

The semiconductor laser device 1 according to the present embodiment is manufactured as follows. With respect to the semiconductor layer portion 2 which has been grown using a known metal organic chemical vapor deposition (MOCVD) method or the like, the trench grooves Tr1 are selectively formed in the first region 2aa of the semiconductor layer portion 2 using a photolithography process and an etching process.

First Modification

Figure 8:
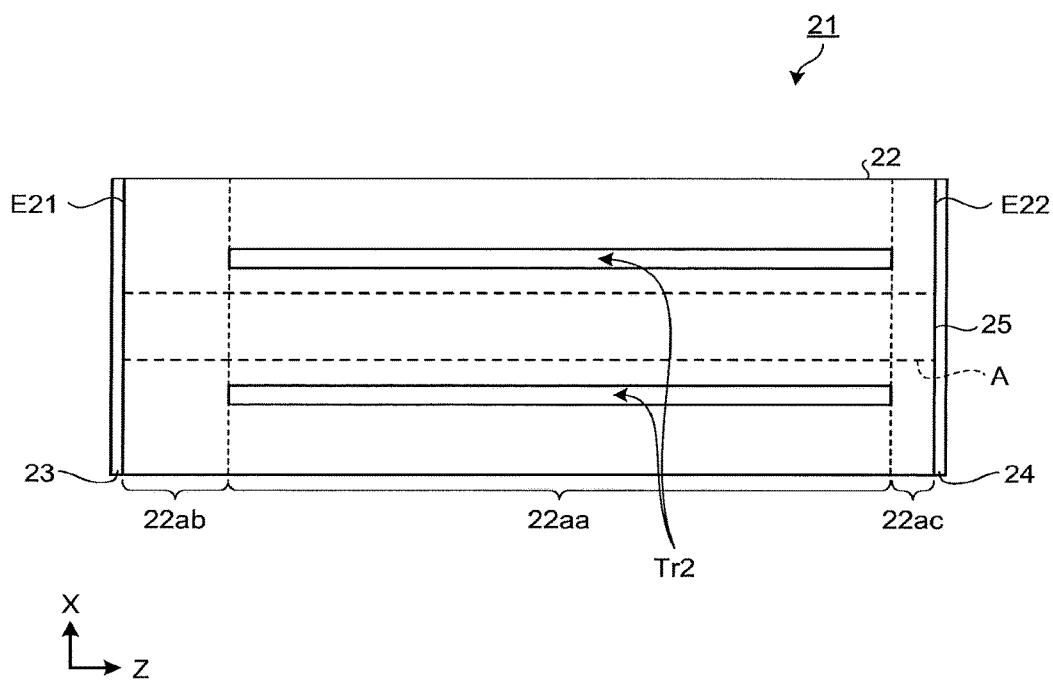
FIG. 8 is a top view of a semiconductor laser device of a first modification.

Next, a semiconductor laser device according to a first modification of the present disclosure will be described. FIG. 8 is a top view of a semiconductor laser device of the first modification. As illustrated in FIG. 8, a semiconductor laser device 21 of the first modification includes a semiconductor layer portion 22 having an active layer, a low-reflectivity coating 23, and a high-reflectivity coating 24. The low-reflectivity coating 23 is formed on a facet E21 on a laser light radiation side of the semiconductor layer portion 22. The high-reflectivity coating 24 is formed on a facet E22 on a rear facet side opposite to the facet E21.

Furthermore, the semiconductor laser device 21 includes an upper electrode 25 formed on a top surface of the semiconductor layer portion 22. The upper electrode 25 is in contact with the semiconductor layer portion 22 inside an opening A.

The semiconductor layer portion 22 includes a second region 22ab located in the vicinity of the facet E21, a third region 22ac located in the vicinity of the facet E22, and a first region 22aa located between the second region 22ab and the third region 22ac.

On the top surface of the semiconductor layer portion 22 in the first region 22aa, trench grooves Tr2 stretching in a z-direction are formed, and a stripe region (see FIG. 1) is formed between the trench grooves Tr2. On the other hand, no trench groove Tr2 is formed in the second region 22ab and the third region 22ac, and the top surface of the semiconductor layer portion 22 has a constant height.

Therefore, in the second region 22ab and the third region 22ac, there is no optical confinement effect of the laser light in a horizontal direction to the stripe region, and the optical confinement effect of the laser light in the horizontal direction to the stripe region is smaller than that in the first region 22aa.

Here, in the semiconductor layer portion 22 of the semiconductor laser device 21, no trench groove is formed in the second region 22ab on a facet E21 side. In the second region 22ab, there is no trench groove and thus there is no ridge structure, and accordingly, high-order horizontal lateral mode confinement to the stripe region is weakened. Then, in the semiconductor laser device 21, light of the high-order horizontal lateral mode with a large angle of the FFPh is reduced in light included in the laser light to be output. As a result, an angle of the FFPh of the laser light to be output by the semiconductor laser device 21 is decreased. Therefore, the semiconductor laser device 21 according to the first modification is a semiconductor laser device that has a favorable coupling efficiency to an optical fiber.

Second Modification

Figure 9:
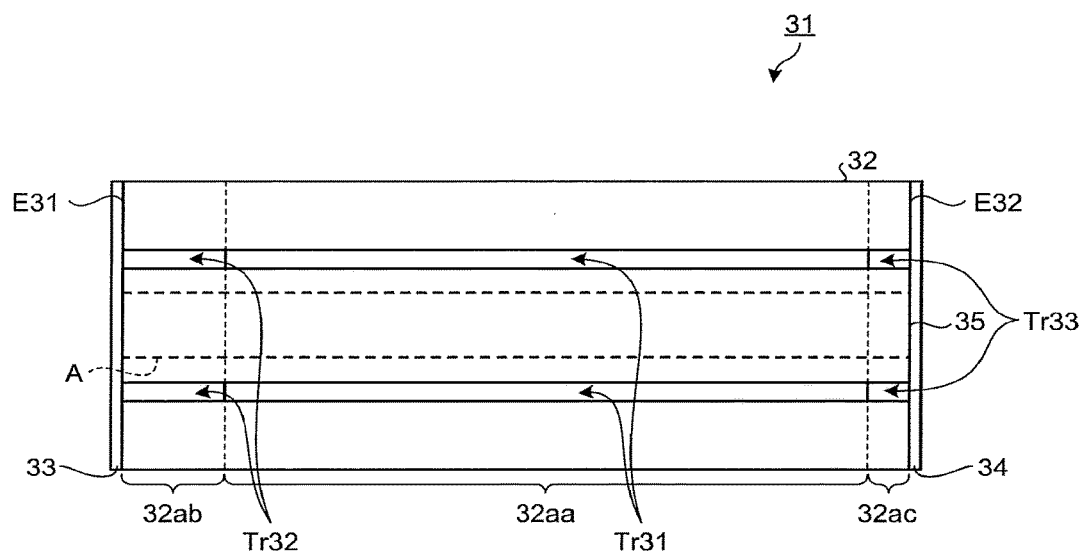
FIG. 9 is a top view of a semiconductor laser device of a second modification.

Next, a semiconductor laser device according to a second modification of the present disclosure will be described. FIG. 9 is a top view of a semiconductor laser device of the second modification. As illustrated in FIG. 9, a semiconductor laser device 31 of the second modification includes a semiconductor layer portion 32 having an active layer, a low-reflectivity coating 33, and a high-reflectivity coating 34. The low-reflectivity coating 33 is formed on a facet E31 on a laser light radiation side of the semiconductor layer portion 32. The high-reflectivity coating 34 is formed on a facet E32 on a rear facet side opposite to the facet on the laser light radiation side.

Furthermore, the semiconductor laser device 31 includes an upper electrode 35 formed on a top surface of the semiconductor layer portion 32. The upper electrode 35 is in contact with the semiconductor layer portion 32 inside an opening A.

The semiconductor layer portion 32 includes a second region 32ab located in the vicinity of the facet E31, a third region 32ac located in the vicinity of the facet E32, and a first region 32aa located between the second region 32ab and the third region 32ac.

On the top surface of the semiconductor layer portion 32 in the first region 32aa, trench grooves Tr31 stretching in a z-direction are formed. On the other hand, on the top surface of the semiconductor layer portion 32 in each of the second region 32ab and the third region 32ac, trench grooves Tr32 and trench grooves Tr33 stretching in the z-direction are formed. A stripe region is formed between the trench grooves Tr31, the trench grooves Tr32, and the trench grooves Tr33.

Regarding the trench grooves Tr32 and the trench grooves Tr33, a depth from the topmost surface of the semiconductor layer portion 32 to the bottom of each trench groove is less than that of the trench grooves Tr31.

Therefore, in the second region 32ab and the third region 32ac, the optical confinement effect of the laser light in a horizontal direction to the stripe region is smaller than that in the first region 32aa.

The depth of the trench grooves Tr31 is, for example, 1000 nm. The depth of each of the trench grooves Tr32 and the trench grooves Tr33 is, for example, 200 nm.

Here, the semiconductor layer portion 32 of the semiconductor laser device 31 includes trench grooves Tr32, which are trench grooves of a shallow depth, in the second region 32ab on the facet E31 side. In the second region 32ab, the trench grooves are of a shallow depth, and accordingly, high-order horizontal lateral mode confinement to the stripe region is weakened. Then, in the semiconductor laser device 31, light of the high-order horizontal lateral mode with a large angle of the FFPh is reduced in light included in the laser light to be output. As a result, an angle of the FFPh of the laser light to be output by the semiconductor laser device 31 is decreased. Therefore, the semiconductor laser device 31 according to the second modification is a semiconductor laser device that has a favorable coupling efficiency to an optical fiber.

As with the semiconductor laser device 31 of the second modification, trench grooves may be formed in the second region. The effects of the present disclosure are exerted if it is a configuration in which a trench groove depth in the second region is less than a trench groove depth in the first region and optical confinement in the horizontal direction is weak in the second region. A configuration may be employed in which the depth of the trench grooves Tr32 and that of the trench grooves Tr33 are different from each other.

Although the example in which the semiconductor layer portion 32 does not include a current non-injection region has been described as the second modification, the current non-injection region may be provided.

Third Modification

Figure 10:
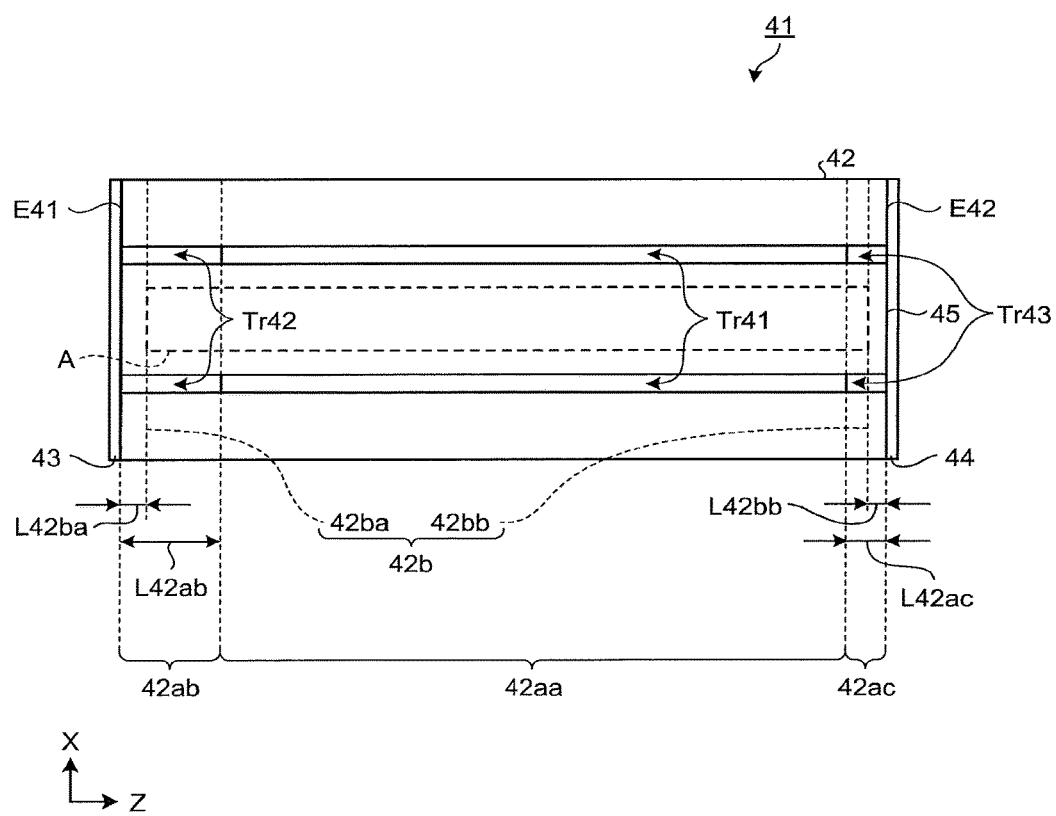
FIG. 10 is a top view of a semiconductor laser device of a third modification.

Next, a semiconductor laser device according to a third modification of the present disclosure will be described. FIG. 10 is a top view of a semiconductor laser device of the third modification. As illustrated in FIG. 10, a semiconductor laser device 41 of the third modification includes a semiconductor layer portion 42 having an active layer, a low-reflectivity coating 43, and a high-reflectivity coating 44. The low-reflectivity coating 43 is formed on a facet E41 on a laser light radiation side of the semiconductor layer portion 42. The high-reflectivity coating 44 is formed on a facet E42 on a rear facet side opposite to the facet E41.

Furthermore, the semiconductor laser device 41 includes an upper electrode 45 formed on a top surface of the semiconductor layer portion 42. The upper electrode 45 is in contact with the semiconductor layer portion 42 inside an opening A. The semiconductor layer portion 42 includes a current non-injection region 42b into which no current is injected. The current non-injection region 42b includes a first current non-injection region 42ba formed on a facet E41 side and a second current non-injection region 42bb formed on a facet E42 side along a z-direction. Thus, the semiconductor laser device 41 is a semiconductor laser device in which the COD is prevented by the current non-injection region 42b from occurring.

The semiconductor layer portion 42 includes a second region 42ab located in the vicinity of the facet E41, a third region 42ac located in the vicinity of the facet E42, and a first region 42aa located between the second region 42ab and the third region 42ac.

On the top surface of the semiconductor layer portion 42 in the first region 42aa, trench grooves Tr41 stretching in the z-direction are formed. On the other hand, on the top surface of the semiconductor layer portion 42 in each of the second region 42ab and the third region 42ac, trench grooves Tr42 and trench grooves Tr43 stretching in the z-direction are formed. A stripe region is formed between the trench grooves Tr41, the trench grooves Tr42, and the trench grooves Tr43.

Regarding the trench grooves Tr42 and the trench grooves Tr43, a depth from the topmost surface of the semiconductor layer portion 42 to the bottom of each trench groove is less than that of the trench grooves Tr41.

Therefore, in the second region 42ab and the third region 42ac, the optical confinement effect of the laser light in a horizontal direction to the stripe region is smaller than that in the first region 42aa.

The depth of the trench grooves Tr41 is, for example, 1000 nm. The depth of each of the trench grooves Tr42 and the trench grooves Tr43 is, for example, 200 nm.

Also in that case, the length L42ba of the first current non-injection region 42ba is preferably less than the length L42ab of the second region 42ab in the z-direction. Similarly, the length L42bb of the second current non-injection region 42bb is preferably less than the length L42ac of the third region 42ac in the z-direction.

Here, the semiconductor layer portion 42 of the semiconductor laser device 41 includes trench grooves Tr42, which are trench grooves of a shallow depth, in the second region 42*ab* on the facet E41 side. In the second region 42*ab*, the trench grooves are of a shallow depth, and accordingly, high-order horizontal lateral mode confinement to the stripe region is weakened. Then, in the semiconductor laser device 41, light of the high-order horizontal lateral mode with a large angle of the FFPh is reduced in light included in the laser light to be output. As a result, an angle of the FFPh of the laser light to be output by the semiconductor laser device 41 is decreased. Therefore, the semiconductor laser device 41 according to the third modification is a semiconductor laser device that has a favorable coupling efficiency to an optical fiber.

Fourth Modification

Figure 11:
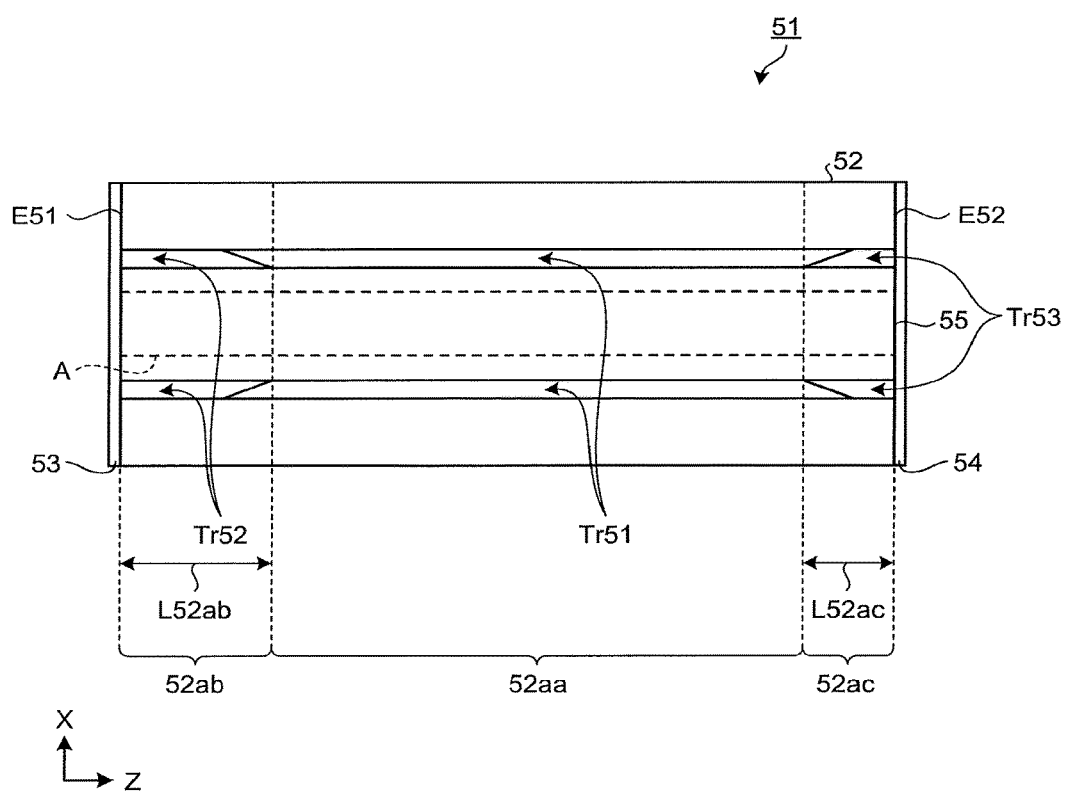
FIG. 11 is a top view of a semiconductor laser device of a fourth modification.

Next, a semiconductor laser device according to a fourth modification of the present disclosure will be described. FIG. 11 is a top view of a semiconductor laser device of the fourth modification. As illustrated in FIG. 11, a semiconductor laser device 51 of the fourth modification includes a semiconductor layer portion 52 having an active layer, a low-reflectivity coating 53, and a high-reflectivity coating 54. The low-reflectivity coating 53 is formed on a facet E51 on a laser light radiation side of the semiconductor layer portion 52. The high-reflectivity coating 54 is formed on a facet E52 on a rear facet side opposite to the facet E51.

Furthermore, the semiconductor laser device 51 includes an upper electrode 55 formed on a top surface of the semiconductor layer portion 52. The upper electrode 55 is in contact with the semiconductor layer portion 52 inside an opening A.

The semiconductor layer portion 52 includes a second region 52*ab* located in the vicinity of the facet E51, a third region 52*ac* located in the vicinity of the facet E52, and a first region 52*aa* located between the second region 52*ab* and the third region 52*ac*.

On the top surface of the semiconductor layer portion 52 in the first region 52*aa*, trench grooves Tr51 stretching in a z-direction are formed. On the other hand, on the top surface of the semiconductor layer portion 52 in each of the second region 52*ab* and the third region 52*ac*, trench grooves Tr52 and trench grooves Tr53 stretching in the z-direction are formed. A stripe region is formed between the trench grooves Tr51, the trench grooves Tr52, and the trench grooves Tr53.

Borders between the trench grooves Tr51 and the trench grooves Tr52, and borders between the trench grooves Tr51 and the trench grooves Tr53 are formed such that a width of the trench grooves Tr51 is narrowed while widths of the trench groove Tr52 and the trench groove Tr53 are widened toward both facets along the z-direction, and total width of the trench grooves is constant. In the semiconductor laser device 51, regarding the trench grooves Tr52 and the trench grooves Tr53, a depth from the topmost surface of the semiconductor layer portion 52 to the bottom of each trench groove is less than that of the trench grooves Tr51. The depth of the trench grooves Tr51 is, for example, 1000 nm. The depth of each of the trench grooves Tr52 and the trench grooves Tr53 is, for example, 200 nm.

Therefore, in the second region 52*ab* and the third region 52*ac*, the optical confinement effect of the laser light in a horizontal direction to the stripe region is smaller than that in the first region 52*aa*.

Here, the semiconductor layer portion 52 of the semiconductor laser device 51 includes trench grooves Tr52, which are trench grooves of a shallow depth, in the second region 52*ab* on the facet E51 side. In the second region 52*ab*, the trench grooves are of a shallow depth, and accordingly, high-order horizontal lateral mode confinement to the stripe region is weakened. Then, in the semiconductor laser device 51, light of the high-order horizontal lateral mode with a large angle of the FFPh is reduced in light included in the laser light to be output. As a result, an angle of the FFPh of the laser light to be output by the semiconductor laser device 51 is decreased. Therefore, the semiconductor laser device 51 according to the fourth modification is a semiconductor laser device that has a favorable coupling efficiency to an optical fiber.

In the semiconductor laser device 51, borders between the trench grooves Tr51 and the trench grooves Tr52 are inclined with respect to the z-direction in which laser light is guided. As a result, the guided laser light is prevented from being affected by a rapid change in a refractive index or the like in the borders between the trench grooves Tr51 and the trench grooves Tr52, and thus the output characteristic of the semiconductor laser device is prevented from being adversely affected.

Although the example in which the semiconductor layer portion 52 does not include a current non-injection region has been described as the fourth modification, the current non-injection region may be provided. Also in that case, the length of the current non-injection region on the facet E51 side is preferably less than the length L52*ab* of the second region 52*ab* in the z-direction. Similarly, the length of the current non-injection region on the facet E52 side is preferably less than the length L52*ac* of the third region 52*ac* in the z-direction. In that case, the length L52*ab* of the second region 52*ab* and the length L52*ac* of the third region 52*ac* refer to the length from the facets E51 and E52 to a position where the width of the trench grooves Tr51 is made constant, as illustrated in FIG. 11.

Fifth Modification

Figure 12:
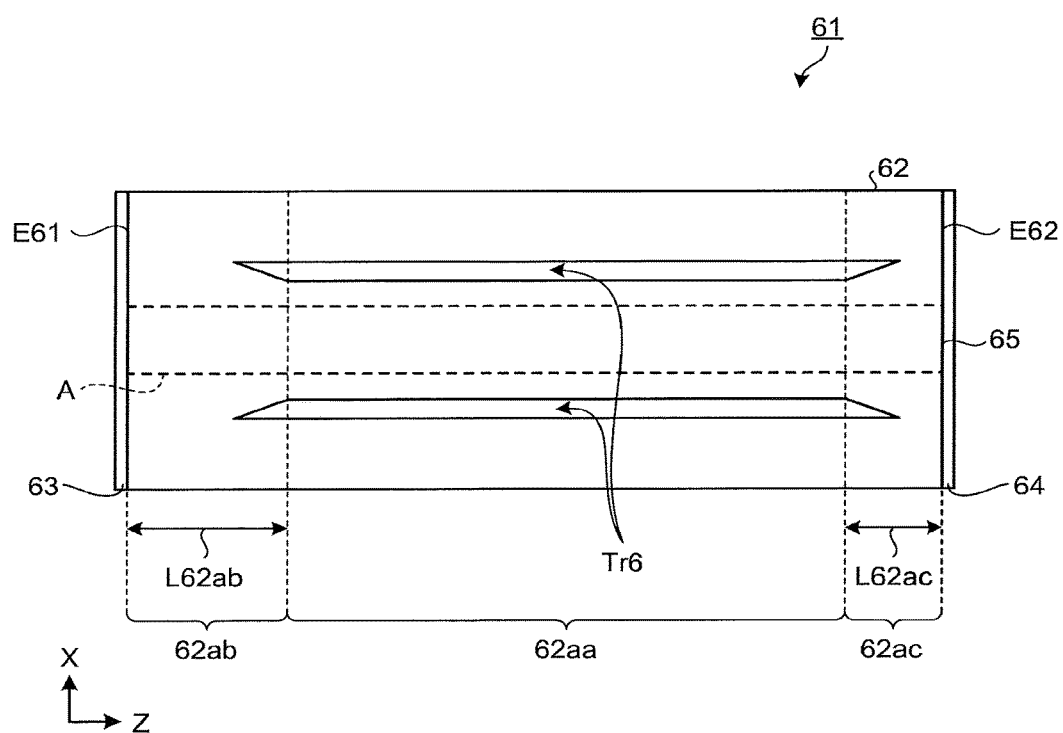
FIG. 12 is a top view of a semiconductor laser device of a fifth modification.

Next, a semiconductor laser device according to a fifth modification of the present disclosure will be described. FIG. 12 is a top view of a semiconductor laser device of the fifth modification. As illustrated in FIG. 12, a semiconductor laser device 61 of the fifth modification includes a semiconductor layer portion 62 having an active layer, a low-reflectivity coating 63, and a high-reflectivity coating 64. The low-reflectivity coating 63 is formed on a facet E61 on a laser light radiation side of the semiconductor layer portion 62. The high-reflectivity coating 64 is formed on a facet E62 on a rear facet side opposite to the facet E61.

Furthermore, the semiconductor laser device 61 includes an upper electrode 65 formed on a top surface of the semiconductor layer portion 62. The upper electrode 65 is in contact with the semiconductor layer portion 62 inside an opening A.

The semiconductor layer portion 62 includes a second region 62*ab* located in the vicinity of the facet E61, a third region 62*ac* located in the vicinity of the facet E62, and a first region 62*aa* located between the second region 62*ab* and the third region 62*ac*.

On the top surface of the semiconductor layer portion 62 in the first region 62*aa*, trench grooves Tr6 stretching in a z-direction are formed, and a stripe region is formed between the trench grooves Tr6. On the other hand, no trench groove Tr6 is formed in the second region 62*ab* and the third region 62*ac*, and the top surface of the semiconductor layer portion 62 has a constant height.

Therefore, in the second region 62*ab* and the third region 62*ac*, there is no optical confinement effect of the laser light in a horizontal direction to the stripe region, and the optical confinement effect of the laser light in the horizontal direction to the stripe region is smaller than that in the first region 62aa. Regarding both ends of the trench grooves Tr6 along the z-direction, widths of the trench grooves Tr6 are narrowed toward both facets.

Here, in the semiconductor layer portion 62 of the semiconductor laser device 61, no trench groove is formed in the second region 62ab on a facet E61 side. In the second region 62ab, there is no trench groove and thus there is no ridge structure, and accordingly, high-order horizontal lateral mode confinement to the stripe region is weakened. Then, in the semiconductor laser device 61, light of the high-order horizontal lateral mode with a large angle of the FFPh is reduced in light included in the laser light to be output. As a result, an angle of the FFPh of the laser light to be output by the semiconductor laser device 61 is decreased. Therefore, the semiconductor laser device 61 according to the fifth modification is a semiconductor laser device that has a favorable coupling efficiency to an optical fiber.

Although the example in which the semiconductor layer portion 62 does not include a current non-injection region has been described as the fifth modification, the current non-injection region may be provided. Also in that case, the length of the current non-injection region on the facet E61 side is preferably less than the length L62ab of the second region 62ab in the z-direction. Similarly, the length of the current non-injection region on the facet E62 side is preferably less than the length L62ac of the third region 62ac in the z-direction. In that case, the length L62ab of the second region 62ab and the length L62ac of the third region 62ac refer to the length from the facets E61 and E62 to a position where the width of the trench grooves Tr6 is made constant, as illustrated in FIG. 12.

Sixth Modification

Figure 13:
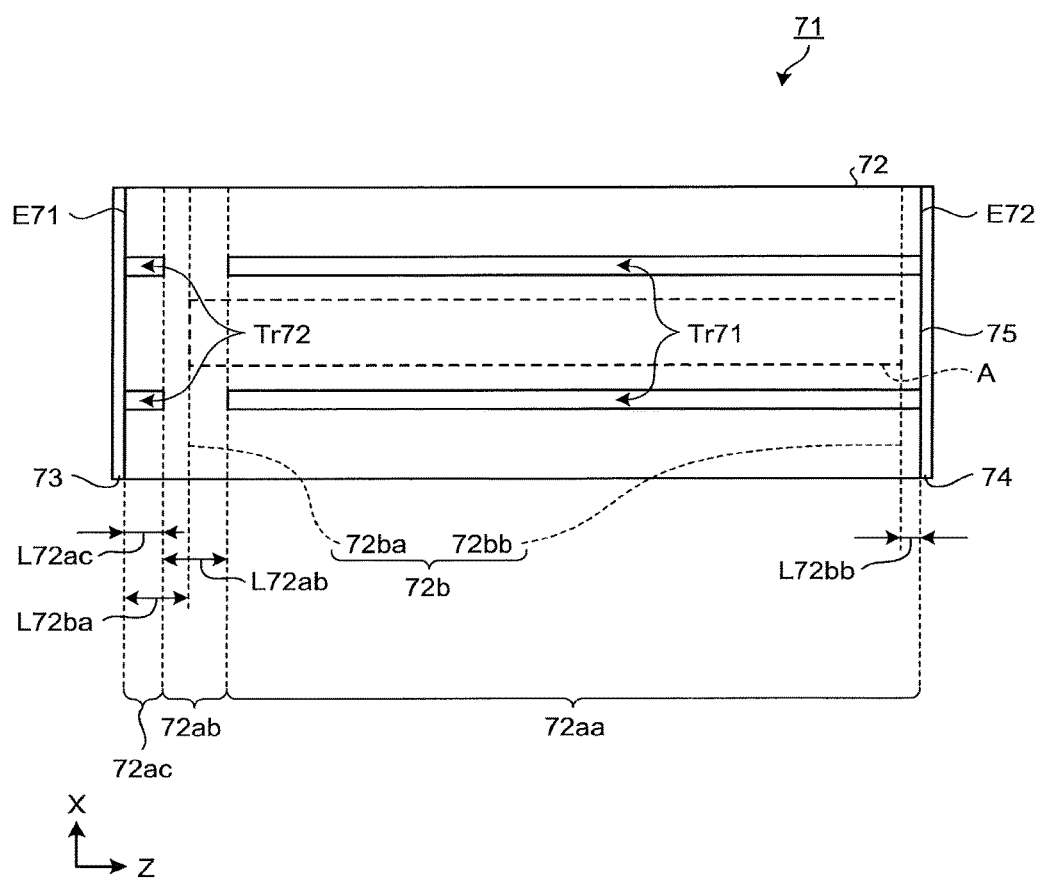
FIG. 13 is a top view of a semiconductor laser device of a sixth modification.

Next, a semiconductor laser device according to a sixth modification of the present disclosure will be described. FIG. 13 is a top view of a semiconductor laser device of the sixth modification. As illustrated in FIG. 13, a semiconductor laser device 71 of the sixth modification includes a semiconductor layer portion 72 having an active layer, a low-reflectivity coating 73, and a high-reflectivity coating 74. The low-reflectivity coating 73 is formed on a facet E71 on a laser light radiation side of the semiconductor layer portion 72. The high-reflectivity coating 74 is formed on a facet E72 on a rear facet side opposite to the facet E71.

Furthermore, the semiconductor laser device 71 includes an upper electrode 75 formed on a top surface of the semiconductor layer portion 72. The upper electrode 75 is in contact with the semiconductor layer portion 72 inside an opening A. The semiconductor layer portion 72 includes a current non-injection region 72b into which no current is injected. The current non-injection region 72b includes a first current non-injection region 72ba formed on a facet E71 side and a second current non-injection region 72bb formed on a facet E72 side along a z-direction. Thus, the semiconductor laser device 71 is a semiconductor laser device in which the COD is prevented by the current non-injection region 72b from occurring.

The semiconductor layer portion 72 includes a third region 72ac located in the vicinity of the facet E71, a first region 72aa located on a facet E72 side, and a second region 72ab located between the third region 72ac and the first region 72aa. In other words, the second region 72ab is formed separately from the facet E71, and the third region 72ac is formed to include the facet E71.

On the top surface of the semiconductor layer portion 72 in each of the first region 72aa and the third region 72ac, trench grooves Tr71 and trench grooves Tr72 stretching in the z-direction are formed. A stripe region is formed between the trench grooves Tr71, and the trench grooves Tr72. On the other hand, no trench groove is formed in the second region 72ab, and the top surface of the semiconductor layer portion 72 has a constant height.

Therefore, in the second region 72ab, there is no optical confinement effect of the laser light in a horizontal direction to the stripe region, and the optical confinement effect of the laser light in the horizontal direction to the stripe region is smaller than those in the first region 72aa and the third region 72ac.

Here, in the semiconductor layer portion 72 of the semiconductor laser device 71, no trench groove is formed in the second region 72ab in the vicinity of the facet E71. In the second region 72ab, there is no trench groove and thus there is no ridge structure, and accordingly, high-order horizontal lateral mode confinement to the stripe region is weakened. Then, in the semiconductor laser device 71, light of the high-order horizontal lateral mode with a large angle of the FFPh is reduced in light included in the laser light to be output. As a result, an angle of the FFPh of the laser light to be output by the semiconductor laser device 71 is decreased. Therefore, the semiconductor laser device 71 according to the sixth modification is a semiconductor laser device that has a favorable coupling efficiency to an optical fiber.

It is not always necessary for the second region 72ab in which no trench groove is formed, as in the case of the semiconductor laser device 71 of the sixth modification, to be formed to include the facet E71, and the second region 72ab may be formed separately from the facet E71. At that time, the trench grooves may not be formed in a region including the facet E72 from a viewpoint of continuity of a cleavage plane. Preferably, the length of the first current non-injection region 72ba is greater than the length L72ac of the third region 72ac in the z-direction. The reason thereof is as follows. When a current is injected into the semiconductor layer portion 72 in a region interposed in the third region 72ac, a high-order horizontal lateral mode occurs in the third region 72ac.

Also in that case, the length L72ba of the first current non-injection region 72ba is preferably less than the total of the length L72ab of the second region 72ab in the z-direction and the length L72ac of the third region 72ac.

Although the example in which the semiconductor layer portion 72 includes a current non-injection region has been described as the sixth modification, the current non-injection region may not be provided.

As described above, according to the present embodiment, the semiconductor laser device having a favorable coupling efficiency to an optical fiber can be provided.

In the embodiment described above, the example has been described in which the trench grooves are formed as a structure for confining light in a horizontal direction to the stripe region (see FIG. 1). However, an optical confinement structure is not limited thereto as long as a region where light and a current pass through is restricted, and an optical waveguide is formed which has an optical confinement effect of laser light in a horizontal direction to the stripe region. The optical confinement structure may be formed by using, for example, a structure such as a ridge structure, a self-aligned structure (SAS), and a buried heterostructure (BH), or ion injection. Structures using these structures as the optical confinement structure will be described below as structural examples.

When trench grooves are used as an optical confinement region, it is easy and inexpensive to manufacture a semiconductor laser device. Furthermore, there is the following advantage. A protruding portion such as a ridge is not formed on a p-type contact layer side, which makes horizontal bonding easy when performing bonding with the p-type contact layer side down on a submount.

First Structural Example

Figure 16:
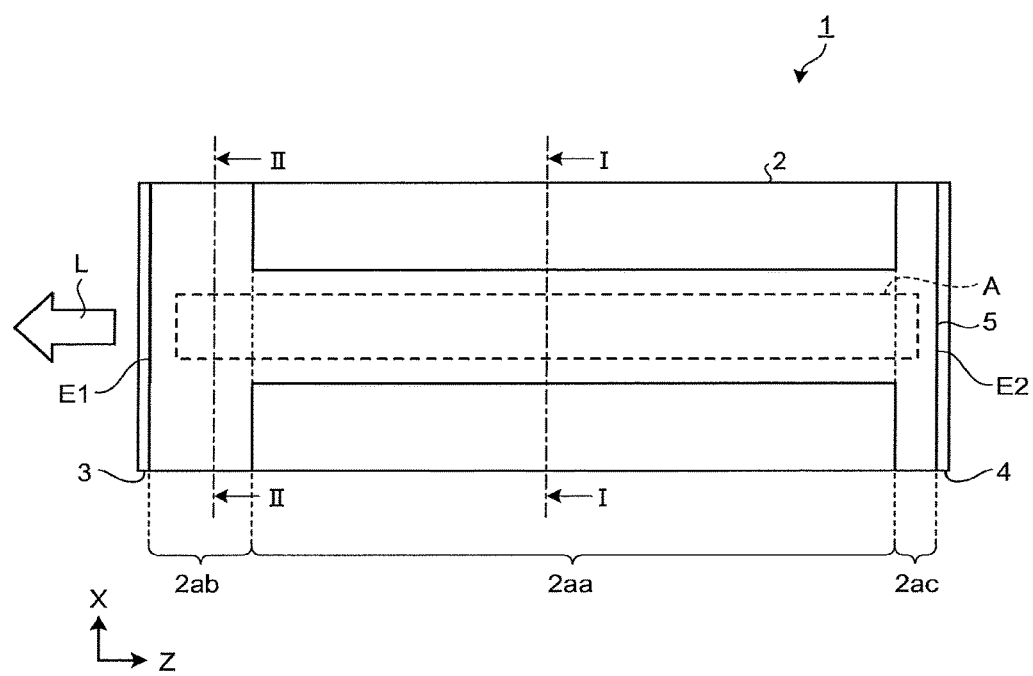
FIG. 16 is a top view of a semiconductor laser device of a first structural example.

A semiconductor laser device including a ridge structure according to a first structural example will be described. FIG. 16 is a top view of the semiconductor laser device of the first structural example. As illustrated in FIG. 16, a semiconductor layer portion 2 includes a second region tab located in the vicinity of a facet E1, a third region 2ac located in the vicinity of a facet E2, and a first region 2aa located between the second region 2ab and the third region 2ac. The semiconductor laser device 1 includes an upper electrode 5 formed on a top surface of the semiconductor layer portion 2. The upper electrode 5 is in contact with the semiconductor layer portion 2 inside an opening A.

Figure 17:
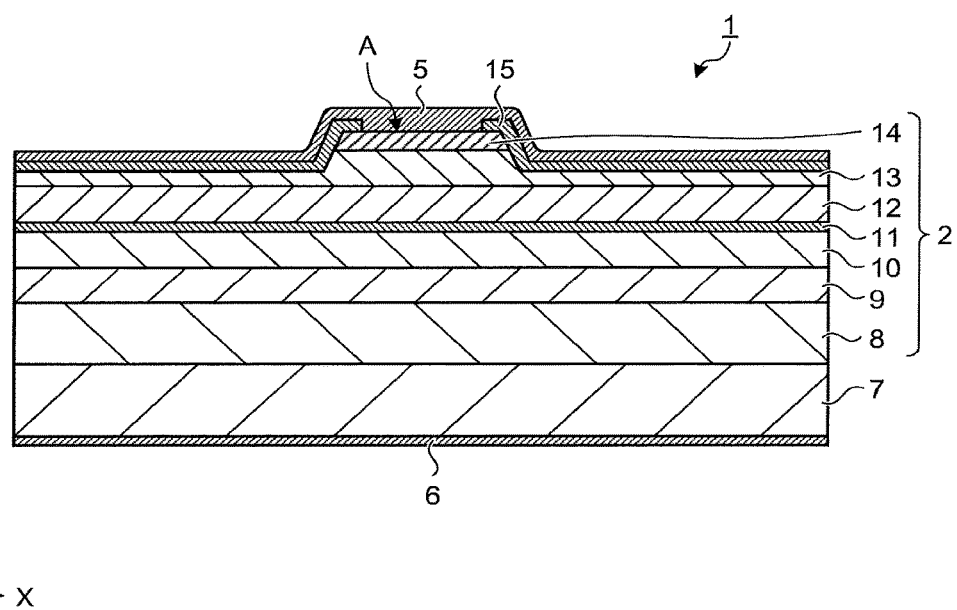
FIG. 17 is an example of a cross-sectional view taken along a line I-I of the semiconductor laser device of the first structural example.

FIG. 17 is an example of a cross-sectional view taken along a line I-I of the semiconductor laser device of the first structural example. As illustrated in FIG. 17, in the semiconductor laser device 1 including the ridge structure, the ridge structure for confining light in an x-direction is formed at least a part of a p-type cladding layer 13 immediately beneath the opening A. A cross-sectional view taken along a line II-II of the semiconductor laser device 1 of the first structural example may be the same as FIG. 4, and therefore a description thereof will be omitted.

Thus, the ridge structure may be formed as the first region 2aa, and a structure without the ridge structure may be formed as the second region 2ab having an optical confinement effect of laser light L in the horizontal direction smaller than the first region 2aa. The ridge structure has an advantage that it is easy and inexpensive to manufacture the semiconductor laser device 1.

Second Structural Example

Figure 18:
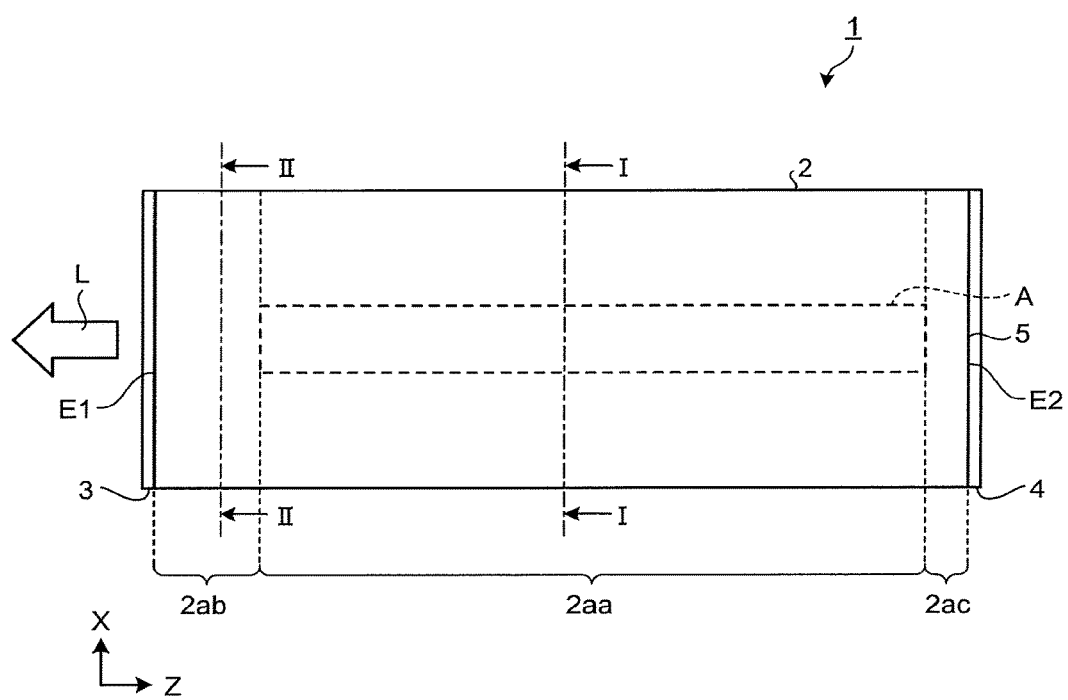
FIG. 18 is a top view of a semiconductor laser device of a second structural example.

A semiconductor laser device including an SAS according to a second structural example will be described. FIG. 18 is a top view of the semiconductor laser device of the second structural example. As illustrated in FIG. 18, a semiconductor layer portion 2 includes a second region 2ab located in the vicinity of a facet E1, a third region 2ac located in the vicinity of a facet E2, and a first region 2aa located between the second region 2ab and the third region 2ac. The semiconductor laser device 1 includes an upper electrode 5 formed on a top surface of the semiconductor layer portion 2. The whole face of the upper electrode 5 is in contact with the semiconductor layer portion 2. However, a current is constricted by a current blocking layer described later and injected into an opening A.

Figure 19:
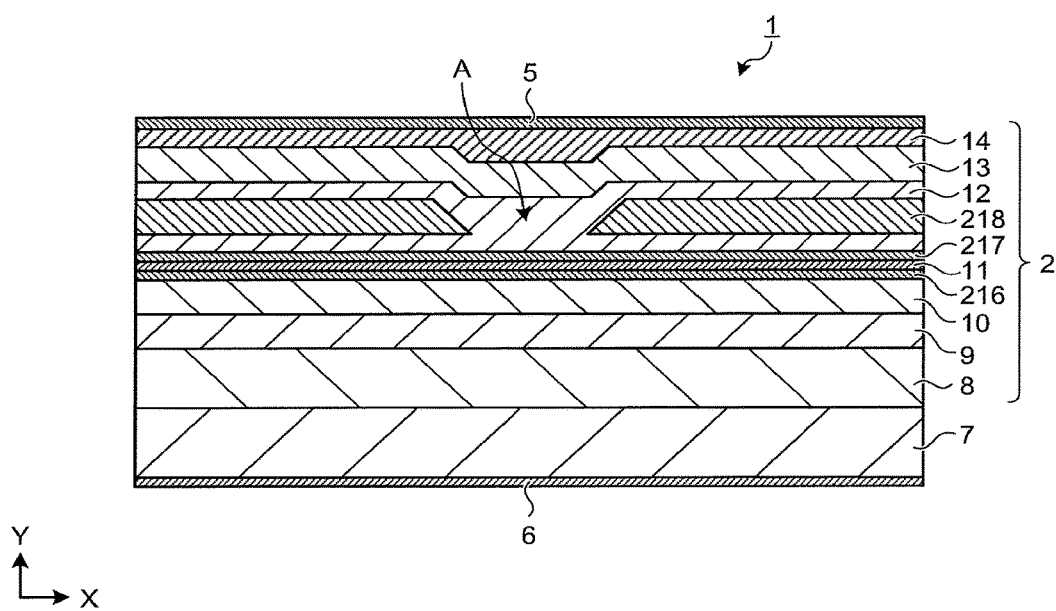
FIG. 19 is an example of a cross-sectional view taken along a line I-I of the semiconductor laser device of the second structural example.

FIG. 19 is an example of a cross-sectional view taken along a line I-I of the semiconductor laser device of the second structural example. As illustrated in FIG. 19, in the semiconductor laser device 1 having the SAS, a lower carrier blocking layer 216 and an upper carrier blocking layer 217 are formed. The lower carrier blocking layer 216 and the upper carrier blocking layer 217 are formed on both sides of an active layer 11 so as to interpose the active layer 11 therebetween, and include n-AlGaAs having larger band gap energy than other layers. Furthermore, in the semiconductor laser device 1, a current blocking layer 218 formed of n-AlGaAs is arranged in a p-type guide layer 12 (in the figure, a position located midway in the thickness thereof). By the current blocking layer 218 having the opening A, highly efficient current injection to the active layer 11 from the upper electrode 5 is achieved.

Figure 20:
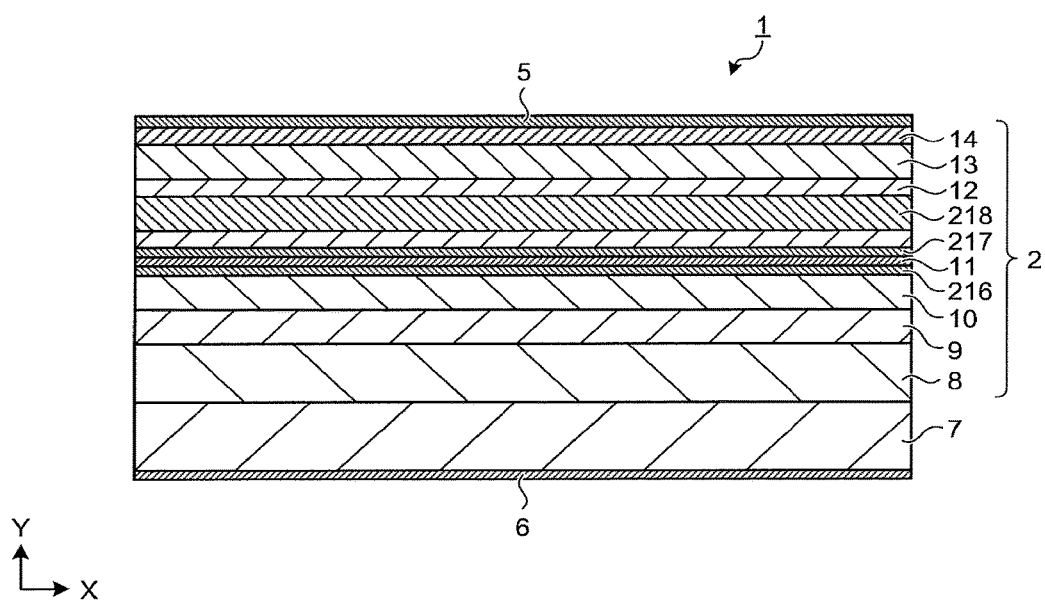
FIG. 20 is a cross-sectional view taken along a line II-II of the semiconductor laser device of the second structural example.

FIG. 20 is a cross-sectional view taken along a line II-II of the semiconductor laser device of the second structural example. As illustrated in FIG. 20, the current blocking layer 218 does not have an opening in the second region 2ab and is formed with a uniform thickness in the second region 2ab.

Thus, the SAS may be formed as the first region 2aa, and a structure without the SAS may be formed as the second region 2ab having an optical confinement effect of laser light L in the horizontal direction smaller than the first region 2aa. In the SAS, a surface on a side of a p-type contact layer 14 is flat similarly to the case where trench grooves are used, and therefore, the SAS is excellent in bonding properties. Furthermore, since a leakage current can be suppressed in the horizontal direction by the current blocking layer 218, there is an advantage of more freedom in designing the optical confinement.

Third Structural Example

Figure 21:
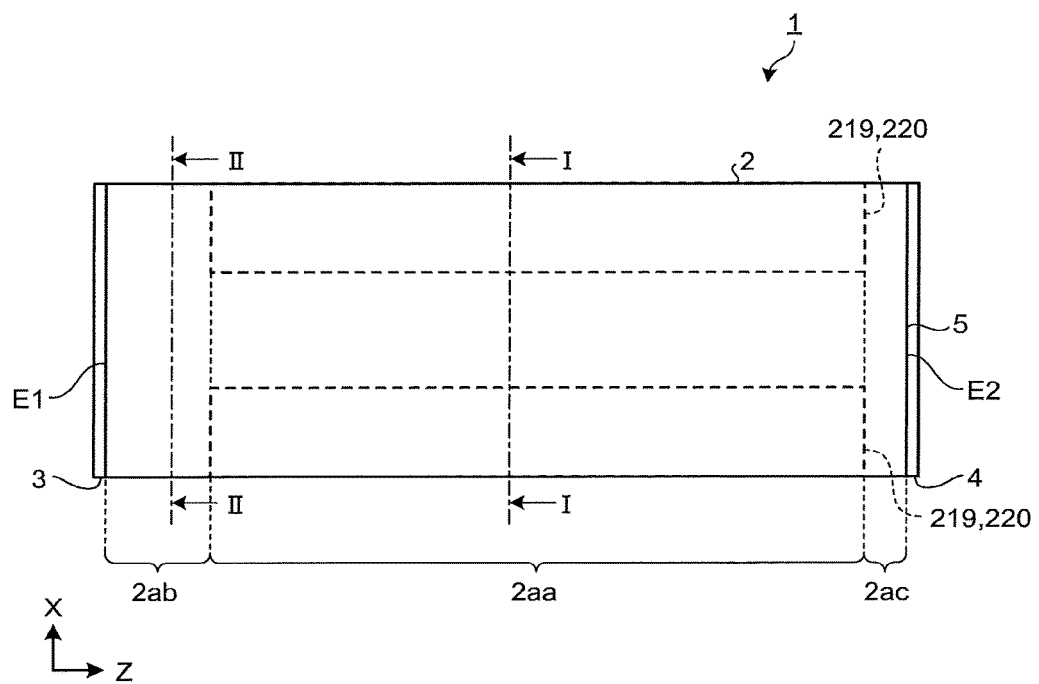
FIG. 21 is a top view of a semiconductor laser device of a third structural example.

A semiconductor laser device including a BH structure according to a third structural example will be described. FIG. 21 is a top view of the semiconductor laser device of the third structural example. As illustrated in FIG. 21, a semiconductor layer portion 2 includes a second region 2ab located in the vicinity of a facet E1, a third region 2ac located in the vicinity of a facet E2, and a first region 2aa located between the second region 2ab and the third region 2ac. The semiconductor laser device 1 includes an upper electrode 5 formed on a top surface of the semiconductor layer portion 2. The whole face of the upper electrode 5 is in contact with the semiconductor layer portion 2. However, a current is constricted by a p-type current blocking layer 219 and an n-type current blocking layer 220 described later and injected.

Figure 22:
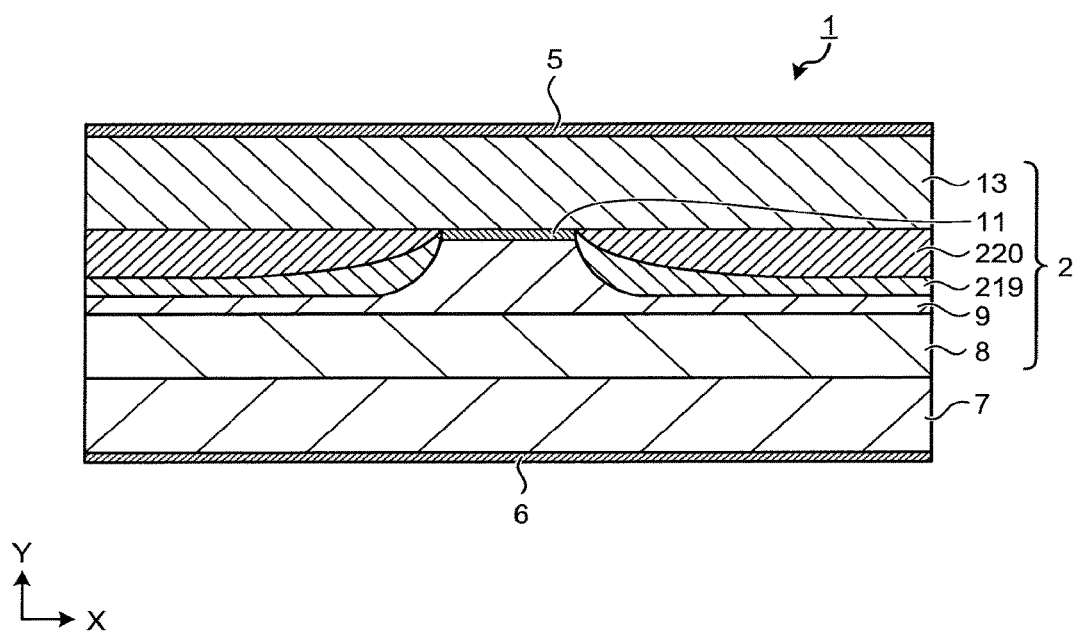
FIG. 22 is an example of a cross-sectional view taken along a line I-I of the semiconductor laser device of the third structural example.

FIG. 22 is an example of a cross-sectional view taken along a line I-I of the semiconductor laser device of the third structural example. As illustrated in FIG. 22, in the semiconductor laser device 1 having the BH structure, an upper part of an n-type cladding layer 9 and an active layer 11 are processed to have a mesa shape, and the p-type current blocking layer 219 and the n-type current blocking layer 220 are formed adjacent to the mesa shape, thereby forming a current blocking layer. Since the current blocking layer has a function to block an injection current, the presence of the current blocking layer constricts a current which has been injected to increase density of carriers to be injected into the active layer 11, to reduce a threshold current value, and to improve light-emitting efficiency.

Figure 23:
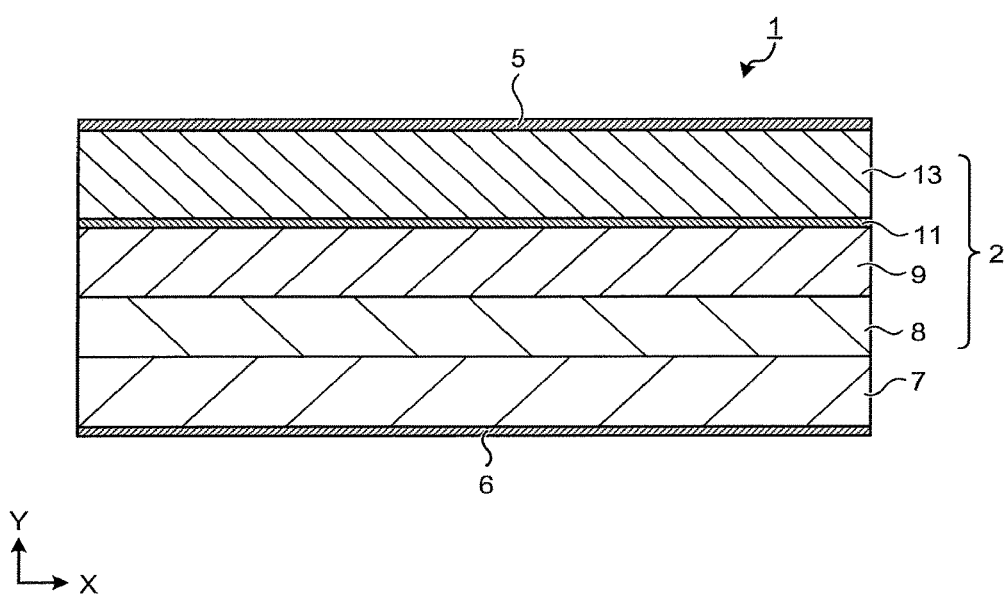
FIG. 23 is a cross-sectional view taken along a line II-II of the semiconductor laser device of the third structural example.

FIG. 23 is a cross-sectional view taken along a line II-II of the semiconductor laser device of the third structural example. As illustrated in FIG. 23, in the second region 2ab of the semiconductor laser device 1, a current blocking layer including the p-type current blocking layer 219 and the n-type current blocking layer 220 is not formed.

Thus, the BH structure may be formed as the first region 2aa, and a structure without the BH structure may be formed as the second region 2ab having an optical confinement effect of laser light L in the horizontal direction smaller than the first region 2aa. Similar to the case where trench grooves are used, the BH structure is excellent in bonding properties. In addition, the BH structure has an extremely low leakage current and is excellent in current blocking properties.

As described above, effects of the present disclosure can be obtained by any structure as long as it is a structure which has an optical confinement effect of the laser light L in a horizontal direction and in which an optical confinement effect in a horizontal direction is smaller in the second region than in the first region.

In the above embodiment, the GaAs-based materials have been described. However, it is possible to constitute a layer structure from a substrate made of other materials such as InP, or from other material systems, in accordance with a desired oscillation wavelength.

In the above embodiment, the structure has been described in which the n-type buffer layer, the n-type cladding layer, the n-type guide layer, the active layer, the p-type guide layer, the p-type cladding layer, and the p-type contact layer are formed on the substrate. However, it may be a structure in which the p-type buffer layer, the p-type cladding layer, the p-type guide layer, the active layer, the n-type guide layer, the n-type cladding layer, and the n-type contact layer are sequentially formed on the substrate.

Laser Irradiation Apparatus

Figure 26:
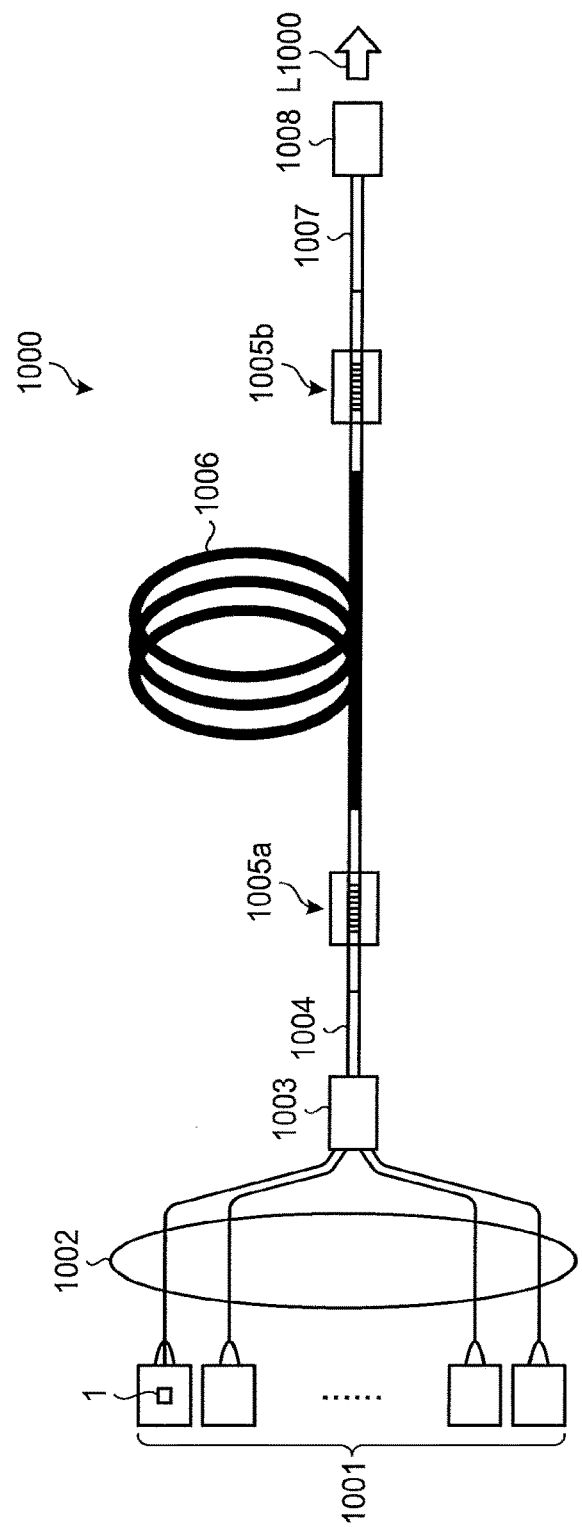
FIG. 26 is a schematic configuration diagram of a laser light irradiation apparatus according to the embodiment of the present disclosure.

FIG. 26 is a schematic configuration diagram of a laser light irradiation apparatus according to the embodiment of the present disclosure. A laser light irradiation apparatus 1000 is an optical fiber laser that includes the semiconductor laser device 1 according to the embodiment.

The laser light irradiation apparatus 1000 includes a plurality of semiconductor laser modules 1001, a plurality of multi-mode optical fibers 1002, a tapered fiber bundle (TFB) 1003, a double-clad optical fiber grating 1005a, an optical amplifying fiber 1006, a double-clad optical fiber grating 1005b, and an optical power connector 1008 connected to a single-mode optical fiber 1007. Each of the semiconductor laser modules 1001 includes the semiconductor laser device 1 which is a pumping light source. The multi-mode optical fibers 1002 are optically connected to the respective semiconductor laser devices 1 of the semiconductor laser modules 1001 and guide pumping light output by the corresponding semiconductor laser devices 1. The TFB 1003 couples the pumping light guided by the multi-mode optical fibers 1002 and causes a double-clad optical fiber 1004 to output the light. The double-clad optical fiber grating 1005a, the optical amplifying fiber 1006, the double-clad optical fiber grating 1005b, and the optical power connector 1008 connected to the single-mode optical fiber 1007 are sequentially connected to the double-clad optical fiber 1004.

A wavelength of the pumping light output by each of the semiconductor laser devices 1 is around 915 nm. The double-clad optical fiber grating 1005a has a reflection central wavelength of approximately 1060 nm, reflectivity of approximately 100% at the central wavelength and in a wavelength bandwidth of approximately 2 nm around the central wavelength, and transmits light with a wavelength of 915 nm almost entirely. The double-clad optical fiber grating 1005b has a central wavelength of approximately 1060 nm, reflectivity of approximately 10 to 30% at the central wavelength, full width at half maximum of a reflection wavelength bandwidth of approximately 0.1 nm, and transmits light with a wavelength of 915 nm almost entirely. Therefore, the double-clad optical fiber gratings 1005a and 1005b configure an optical resonator with respect to light with a wavelength of 1060 nm.

The optical amplifying fiber 1006 has a double-clad structure including a core, an inner cladding layer, and an outer cladding layer. The core includes fused quartz to which ytterbium (Yb) and aluminum (Al), which are rare-earth elements, have been added.

In the laser light irradiation apparatus 1000, when each semiconductor laser device 1 outputs pumping light with a wavelength of around 915 nm, each multi-mode optical fiber 1002 guides corresponding pumping light, and the TFB 1003 couples the pumping light thus guided and outputs the pumping light to the double-clad optical fiber 1004. The double-clad optical fiber 1004 propagates the coupled pumping light in a multi-mode. Then, the double-clad optical fiber grating 1005a transmits the pumping light to cause the pumping light to reach the optical amplifying fiber 1006.

The pumping light which has reached the optical amplifying fiber 1006, while propagating in the core and the inner cladding layer of the optical amplifying fiber 1006 in a multi-mode, photoexcites Yb added to the core to cause Yb to emit fluorescence having a wavelength bandwidth including a wavelength of 1060 nm. The fluorescence propagates in the core in a single-mode, is amplified by stimulated emission of Yb ions while reciprocating in the optical resonator configured by the double-clad optical fiber gratings 1005a and 1005b, and thereby a laser oscillation is performed at an oscillation wavelength of 1060 nm. The emitted laser light is output as laser light L1000 from the optical power connector 1008 via the double-clad optical fiber grating 1005b and the single-mode optical fiber 1007.

In the laser light irradiation apparatus 1000, since the semiconductor laser device 1 according to the embodiment is used as a pumping light source, the pumping light is efficiently coupled to corresponding multi-mode optical fiber 1002. As a result, it is possible to enhance the power of the laser light L1000 to be output.

The semiconductor laser device according to the present disclosure may be applied to a laser light irradiation apparatuses with various configurations, not limited to the configuration of the laser light irradiation apparatus according to the embodiment described above.

The present disclosure is not limited to the embodiment. A configuration obtained by appropriately combining each component described above is included in the present disclosure. For example, a configuration obtained by combining each modification and each structural example described above is included in the present disclosure. In addition, a person skilled in the art can easily derive a further effect or modification. Accordingly, a broader aspect of the present disclosure is not limited to the embodiment described above, and various modifications are possible.

As described above, the semiconductor laser device and the laser light irradiation apparatus according to the present disclosure are preferably applied, for example, to an industrial laser field.

According to the present disclosure, a semiconductor laser device having a favorable coupling efficiency to an optical fiber may be obtained.

The invention claimed is:

1. A semiconductor laser device comprising:
a semiconductor layer portion having an active layer and performing multi-mode oscillation of laser light, wherein
the semiconductor layer portion includes a first region and a second region, the second region being located closer to a facet on a laser light radiation side than the first region,
the first region and the second region include a stripe region in which the laser light is guided,
the stripe region has a width of 80 μm or more, the width being along a traversal direction orthogonal to a longitudinal direction of the stripe region,
a second optical confinement effect of the laser light in the traversal direction to a second portion of the stripe region in the second region is less than a first optical confinement effect of the laser light in the traversal direction to a first portion of the stripe region in the first region, the semiconductor layer portion includes a current non-injection region, into which no current is injected, adjacent to the facet on the laser light radiation side, and a length of the current non-injection region along a laser light radiation direction is less than a length of the second region along the laser light radiation direction.

2. The semiconductor laser device according to claim 1, wherein the second portion of the stripe region in the second region has no optical confinement effect of the laser light in the traversal direction.

3. The semiconductor laser device according to claim 1, wherein the length of the second region along the laser light radiation direction is 100 μm or more.

4. The semiconductor laser device according to claim 1, wherein the length of the second region along the laser light radiation direction is 150 μm or more and 250 μm or less.

5. The semiconductor laser device according to claim 1, wherein the semiconductor layer portion further includes a second current non-injection region, into which no current is injected, adjacent to a facet opposite to the facet on the laser light radiation side.

6. The semiconductor laser device according to claim 1, wherein the second region is formed so as to include the facet on the laser light radiation side.

7. The semiconductor laser device according to claim 1, wherein the second region is formed separately from the facet on the laser light radiation side.

8. A laser light irradiation apparatus comprising the semiconductor laser device according to claim 1.

9. A semiconductor laser device comprising:

a semiconductor layer portion having an active layer and performing multi-mode oscillation of laser light, wherein the semiconductor layer portion includes a first region and a second region, the second region being located closer to a facet on a laser light radiation side than the first region, the first region and the second region include a stripe region in which the laser light is guided, the stripe region has a width of 80 μm or more, the width being along a traversal direction orthogonal to a longitudinal direction of the stripe region, a second optical confinement effect of the laser light in the traversal direction to a second portion of the stripe region in the second region is less than a first optical confinement effect of the laser light in the traversal direction to a first portion of the stripe region in the first region, and the semiconductor layer portion includes a current non-injection region, into which no current is injected, adjacent to a facet opposite to the facet on the laser light radiation side.

10. The semiconductor laser device according to claim 9, wherein the second portion of the stripe region in the second region has no optical confinement effect of the laser light in the traversal direction.

11. The semiconductor laser device according to claim 9, wherein a length of the second region along a laser light radiation direction is 100 μm or more.

12. The semiconductor laser device according to claim 9, wherein a length of the second region along a laser light radiation direction is 150 μm or more and 250 μm or less.

13. The semiconductor laser device according to claim 9, wherein the second region is formed so as to include the facet on the laser light radiation side.

14. The semiconductor laser device according to claim 9, wherein the second region is formed separately from the facet on the laser light radiation side.

15. A laser light irradiation apparatus comprising the semiconductor laser device according to claim 9.

* * * * *